United States Patent
Rahman et al.

(10) Patent No.: US 10,567,060 B2
(45) Date of Patent: Feb. 18, 2020

(54) EFFICIENT VECTOR QUANTIZER FOR FD-MIMO SYSTEMS

(71) Applicant: Samsung Electronics Co., Ltd., Suwon-si, Gyeonggi-do (KR)

(72) Inventors: Md. Saifur Rahman, Richardson, TX (US); Eko Onggosanusi, Allen, TX (US); Young-Han Nam, Plano, TX (US); Yang Li, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 507 days.

(21) Appl. No.: 14/806,413

(22) Filed: Jul. 22, 2015

(65) Prior Publication Data

US 2016/0119045 A1 Apr. 28, 2016

Related U.S. Application Data

(60) Provisional application No. 62/068,486, filed on Oct. 24, 2014.

(51) Int. Cl.
*H04B 7/06* (2006.01)
*H04B 7/0456* (2017.01)

(52) U.S. Cl.
CPC ......... *H04B 7/0639* (2013.01); *H04B 7/0486* (2013.01)

(58) Field of Classification Search
CPC .. H04B 7/0617; H04B 7/0626; H04B 7/0413; H04B 7/0456; H04B 7/088; H04B 7/0639; H04B 7/10; H04B 7/0634; H04B 7/0486

(Continued)

(56) References Cited

U.S. PATENT DOCUMENTS

2007/0115909 A1  5/2007 Wang et al.
2008/0316910 A1* 12/2008 Ashikhmin .......... H04B 7/0417
                                                          370/208

(Continued)

FOREIGN PATENT DOCUMENTS

CN  101304300 A  11/2008
CN  101341670 A   1/2009

(Continued)

OTHER PUBLICATIONS

U.S. Appl. No. 14/593,711 entitled "Channel State Information Reporting With Basis Expansion for Advanced Wireless Communications Systems" filed Jan. 9, 2015.
Thomas, et al.; "Method for Obtaining Full Channel State Information for RF Beamforming"; Globecom 2014—Wireless Communications Symposium; Nokia; 2014; pp. 4333-4337.

(Continued)

*Primary Examiner* — David C Payne
*Assistant Examiner* — Sarah Hassan

(57) ABSTRACT

Methods and apparatus for vector quantization of feedback and processing of vector quantized feedback components. A method of operating a UE for vector quantization of feedback includes identifying a grouping method for grouping channel coefficients for vector quantization and identifying a vector quantization codebook for vector quantization of grouped vectors based on one or more control signals received from an eNB. The method includes computing channel coefficients based on at least one channel measurement and grouping the computed channel coefficients according to the identified grouping method to form a set of vectors. The method also includes performing vector quantization of the vectors using the identified vector quantization codebook and processing the quantized vectors into one or more feedback signals. Additionally, the method includes transmitting the one or more feedback signals to the eNB.

20 Claims, 22 Drawing Sheets

(58) Field of Classification Search
USPC .......................................... 375/299; 370/335
See application file for complete search history.

(56) References Cited

U.S. PATENT DOCUMENTS

| | | |
|---|---|---|
| 2009/0047999 A1 | 2/2009 | Xia et al. |
| 2010/0174539 A1 | 7/2010 | Nandhimandalam et al. |
| 2011/0205930 A1* | 8/2011 | Rahman ............... H04B 7/0417 370/252 |
| 2011/0216846 A1 | 9/2011 | Lee et al. |
| 2011/0268100 A1* | 11/2011 | Gorokhov ............. H04B 7/024 370/342 |
| 2011/0274182 A1 | 11/2011 | Mielczarek et al. |
| 2013/0051321 A1* | 2/2013 | Barbieri ............... H04B 7/0626 370/328 |
| 2013/0308715 A1* | 11/2013 | Nam .................... H04B 7/0469 375/267 |
| 2014/0098689 A1 | 4/2014 | Lee et al. |
| 2014/0192917 A1 | 7/2014 | Nam et al. |

FOREIGN PATENT DOCUMENTS

| | | |
|---|---|---|
| CN | 101534268 A | 9/2009 |
| WO | WO 2013/093617 A3 | 6/2013 |
| WO | WO 2014/158255 A1 | 10/2014 |

OTHER PUBLICATIONS

Roh, et al.; "Efficient Feedback Methods for MIMO Channels Based on Parameterization"; IEEE Transactions on Wireless Communications, vol. 6. No. 1.; Jan. 2007; pp. 282-292.

Gray, et al.; "Quantization"; IEEE Transactions on Information Theory, vol. 44, No. 6; Oct. 1998; pp. 2325-2383.

International Search Report and Written Opinion issued for PCT/KR2015/011282 dated Feb. 16, 2016, 8 pgs.

Lee et al., "An Efficient Feedback Compression for Large-Scale MIMO Systems", 2014 IEEE 79th, Vehicular Technology Conference (VTC Spring), May 18-21, 2014, 7 pgs.

Extended European Search Report regarding Application No. 15852506.3, dated Feb. 22, 2018, 11 pages.

Nguyen-Le et al., "Heterogeneous Multiuser Transmission with BEM-Based Limited Feedback over Doubly Selective MIMO Downlink Channels", 2010 IEEE 17th International Conference on Telecommunications (ITC), Apr. 2010, pp. 350-355.

Nguyen-Le et al., "BEM-Based Limited Feedback for Precoding and Scheduling over Doubly Selective Multiuser MISO Downlink Channels", 2010 IEEE International Conference on Communications (ICC), May 2010, 5 pages.

European Patent Office, "Communication pursuant to Article 94(3) EPC," Application No. EP15852506.3, Feb. 5, 2019, 7 pages.

China National Intellectual Property Administration Notification of the First Office Action regarding Application No. 201580045387.5, dated Nov. 22, 2019, 18 pages.

* cited by examiner

EFFICIENT VECTOR QUANTIZER FOR FD-MIMO SYSTEMS

CROSS-REFERENCE TO RELATED APPLICATION(S) AND CLAIM OF PRIORITY

This application claims priority under 35 U.S.C. § 119(e) to U.S. Provisional Patent Application No. 62/068,486 filed on Oct. 24, 2014. The above-identified provisional patent application is hereby incorporated by reference in its entirety.

TECHNICAL FIELD

This disclosure relates generally to full-dimension (FD) multiple-input multiple-output (MIMO) (FD-MIMO) wireless communication systems. More specifically, this disclosure relates to an efficient vector quantizer for FD-MIMO systems.

BACKGROUND

Given the spatial multiplexing provided by FD-MIMO systems, understanding and correctly estimating the channel between a user equipment (UE) and an eNode B (eNB) is important for efficient and effective wireless communication. In order to correctly estimate the channel conditions, a UE will feed back information about channel measurements, e.g., channel state information (CSI), to the eNB. With this information about the channel, the eNB is able to select appropriate communication parameters to efficiently and effectively perform wireless data communication with the UE.

However, with increase in the numbers of antennas and channel paths of wireless communication devices, so too has the amount of feedback increased that may be needed to ideally estimate the channel. This additionally-desired channel feedback can create additional overhead, thus reducing the efficiency of the wireless communication, for example, decrease the data rate.

SUMMARY

Embodiments of the present disclosure provide an efficient vector quantizer for FD-MIMO systems.

In one embodiment, a method of operating a UE for vector quantization of feedback components such as channel coefficients is provided. The method includes identifying a grouping method for grouping channel coefficients for vector quantization and identifying a vector quantization codebook for vector quantization of grouped vectors based on one or more control signals received from an eNB. The method includes computing channel coefficients based on at least one channel measurement and grouping the computed channel coefficients according to the identified grouping method to form a set of vectors. The method also includes performing vector quantization of the vectors using at least one vector quantization codebook and processing the quantized vectors into one or more feedback signals. Additionally, the method includes transmitting the one or more feedback signals to the eNB.

In another embodiment, a method of operating an eNB for processing of vector quantized feedback components such as channel coefficients is provided. The method includes receiving one or more feedback signals from a UE and performing reconstruction of quantized channel coefficients identified from the one or more feedback signals using at least one vector quantization codebook. Additionally, the method includes ungrouping the reconstructed channel coefficients based on a grouping method indicated to the UE by the eNB.

In yet another embodiment, an apparatus of a UE for vector quantization of feedback components such as channel coefficients is provided. The apparatus includes at least one processor and a transceiver. The at least one processor is configured to identify a grouping method for grouping channel coefficients for vector quantization and identify a vector quantization codebook for vector quantization of grouped vectors based on one or more control signals received from an eNB, compute channel coefficients based on at least one channel measurement, group the computed channel coefficients according to the identified grouping method to form a set of vectors, perform vector quantization of the vectors using the identified vector quantization codebook, and process the quantized vectors into one or more feedback signals. The transceiver is configured to transmit the one or more feedback signals to the eNB.

In another embodiment, an apparatus of eNB for processing of vector quantized feedback components such as channel coefficients is provided. The apparatus includes a transceiver and at least one processor. The transceiver is configured to receive one or more feedback signals from a UE. The at least one processor is configured to perform reconstruction of quantized channel coefficients identified from the one or more feedback signals using at least one vector quantization codebook, and ungroup the reconstructed channel coefficients based on a grouping method indicated to the UE by the eNB.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 22, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably-arranged system or device.

The following documents and standards descriptions are hereby incorporated by reference into the present disclosure as if fully set forth herein:

3GPP TS 36.211: "Evolved Universal Terrestrial Radio Access (E-UTRA); Physical channels and modulation", 3GPP TS 36.212, "E-UTRA, Multiplexing and Channel coding", 3GPP TS 36.213, "E-UTRA, Physical Layer Procedures", and R. M. Gray, "Quantization," IEEE Trans. Inform. Theory, vol. 44, No. 6, October 1998.

Figure 1:
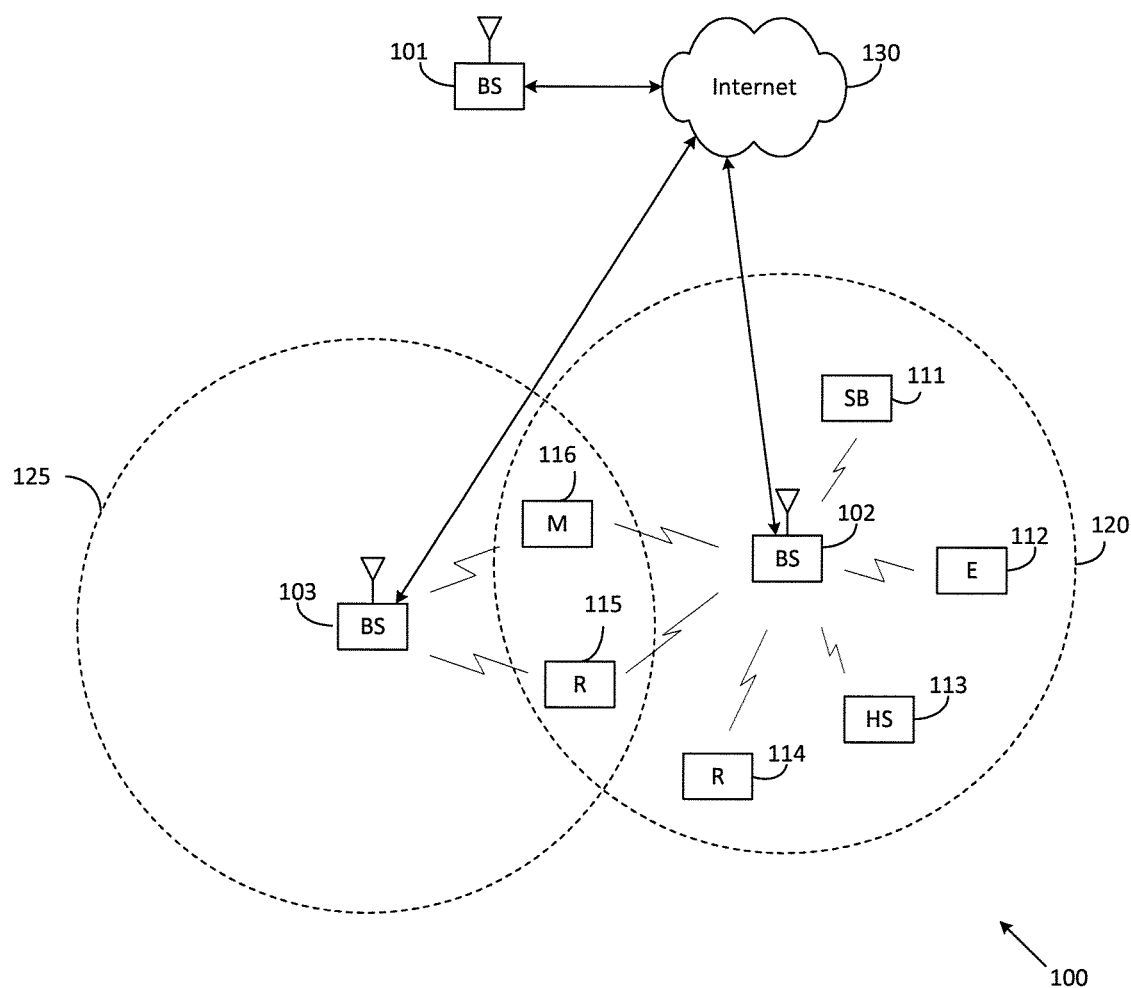
FIG. 1 illustrates an example wireless network according to illustrative embodiments of the present disclosure.
Figure 2:
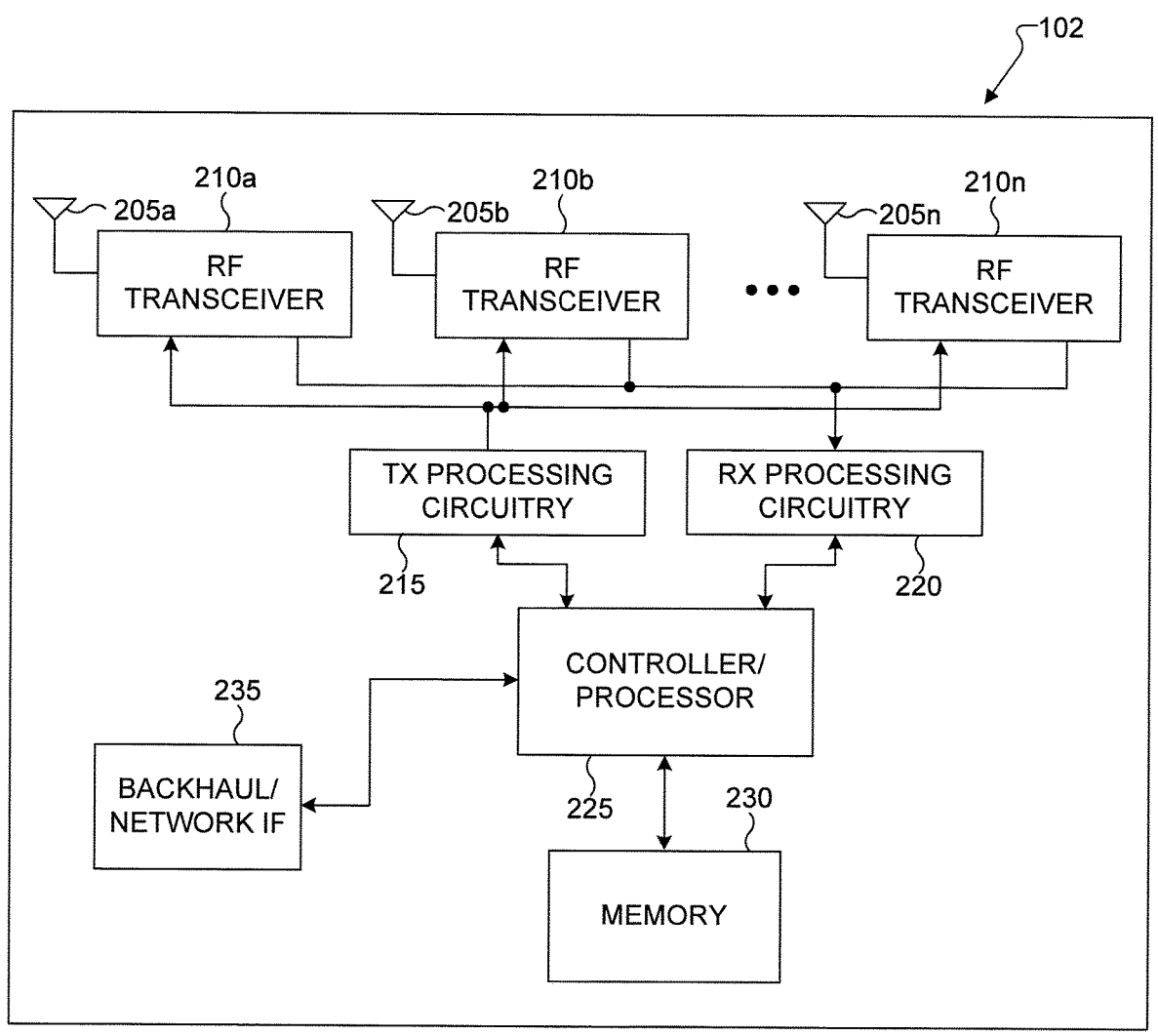
FIG. 2 illustrates an example eNB according to illustrative embodiments of the present disclosure.
Figure 3:
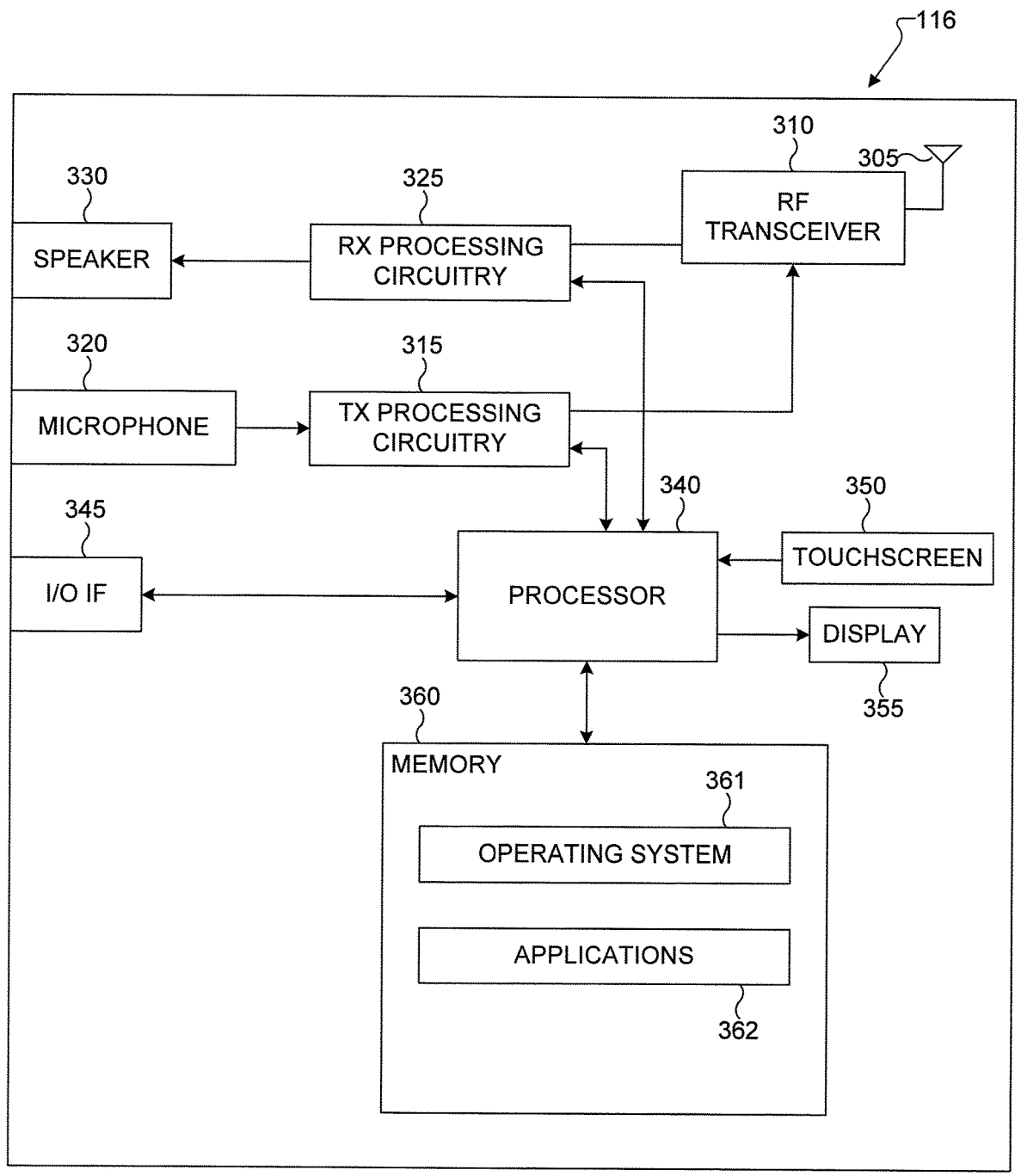
FIG. 3 illustrates an example UE according to illustrative embodiments of the present disclosure.

FIGS. 1-4B below describe various embodiments implemented in wireless communications systems and with the use of OFDM or OFDMA communication techniques. The description of FIGS. 1-3 is not meant to imply physical or architectural limitations to the manner in which different embodiments may be implemented. Different embodiments of the present disclosure may be implemented in any suitably-arranged communications system.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNB 101, an eNB 102, and an eNB 103. The eNB 101 communicates with the eNB 102 and the eNB 103. The eNB 101 also communicates with at least one network 130, such as the Internet, a proprietary Internet Protocol (IP) network, or other data network.

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M), such as a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, WiFi, or other wireless communication techniques.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of the UEs may include circuitry and/or programming for vector quantization of feedback components such as channel coefficients, and one or more of the eNBs may include circuitry and/or programming for processing of vector quantized feedback components such as channel coefficients. Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNBs 101, 102, and/or 103 could provide access to other or additional external networks, such as external telephone networks or other types of data networks.

FIG. 2 illustrates an example eNB 102 according to this disclosure. The embodiment of the eNB 102 illustrated in FIG. 2 is for illustration only, and the eNBs 101 and 103 of FIG. 1 could have the same or similar configuration. However, eNBs come in a wide variety of configurations, and FIG. 2 does not limit the scope of this disclosure to any particular implementation of an eNB.

As shown in FIG. 2, the eNB 102 includes multiple antennas 205a-205n, multiple RF transceivers 210a-210n, transmit (TX) processing circuitry 215, and receive (RX) processing circuitry 220. The eNB 102 also includes a controller/processor 225, a memory 230, and a backhaul or network interface 235.

The RF transceivers 210a-210n receive, from the antennas 205a-205n, incoming RF signals, such as signals transmitted by UEs in the network 100. The RF transceivers 210a-210n down-convert the incoming RF signals to generate IF or baseband signals. The IF or baseband signals are sent to the RX processing circuitry 220, which generates processed baseband signals by filtering, decoding, and/or digitizing the baseband or IF signals. The RX processing circuitry 220 transmits the processed baseband signals to the controller/processor 225 for further processing.

The TX processing circuitry 215 receives analog or digital data (such as voice data, web data, e-mail, or interactive video game data) from the controller/processor 225. The TX processing circuitry 215 encodes, multiplexes, and/or digitizes the outgoing baseband data to generate processed baseband or IF signals. The RF transceivers 210a-210n receive the outgoing processed baseband or IF signals from the TX processing circuitry 215 and up-converts the baseband or IF signals to RF signals that are transmitted via the antennas 205a-205n.

The controller/processor 225 can include one or more processors or other processing devices that control the overall operation of the eNB 102. For example, the controller/processor 225 could control the reception of forward channel signals and the transmission of reverse channel signals by the RF transceivers 210a-210n, the RX processing circuitry 220, and the TX processing circuitry 215 in accordance with well-known principles. The controller/processor 225 could support additional functions as well, such as more advanced wireless communication functions. For instance, the controller/processor 225 could support beam forming or directional routing operations in which outgoing signals from multiple antennas 205a-205n are weighted differently to effectively steer the outgoing signals in a desired direction. Any of a wide variety of other functions could be supported in the eNB 102 by the controller/processor 225. In some embodiments, the controller/processor 225 includes at least one microprocessor or microcontroller.

The controller/processor 225 is also capable of executing programs and other processes resident in the memory 230, such as an OS. The controller/processor 225 can move data into or out of the memory 230 as required by an executing process.

The controller/processor 225 is also coupled to the backhaul or network interface 235. The backhaul or network interface 235 allows the eNB 102 to communicate with other devices or systems over a backhaul connection or over a network. The interface 235 could support communications over any suitable wired or wireless connection(s). For example, when the eNB 102 is implemented as part of a cellular communication system (such as one supporting 5G, LTE, or LTE-A), the interface 235 could allow the eNB 102 to communicate with other eNBs over a wired or wireless backhaul connection. When the eNB 102 is implemented as an access point, the interface 235 could allow the eNB 102 to communicate over a wired or wireless local area network or over a wired or wireless connection to a larger network (such as the Internet). The interface 235 includes any suitable structure supporting communications over a wired or wireless connection, such as an Ethernet or RF transceiver.

The memory 230 is coupled to the controller/processor 225. Part of the memory 230 could include a RAM, and another part of the memory 230 could include a Flash memory or other ROM.

As described in more detail below, the eNB 102 may include circuitry and/or programming for processing of vector quantized feedback components such as channel coefficients. Although FIG. 2 illustrates one example of eNB 102, various changes may be made to FIG. 2. For example, the eNB 102 could include any number of each component shown in FIG. 2. As a particular example, an access point could include a number of interfaces 235, and the controller/processor 225 could support routing functions to route data between different network addresses. As another particular example, while shown as including a single instance of TX processing circuitry 215 and a single instance of RX processing circuitry 220, the eNB 102 could include multiple instances of each (such as one per RF transceiver). Also, various components in FIG. 2 could be combined, further subdivided, or omitted and additional components could be added according to particular needs.

FIG. 3 illustrates an example UE 116 according to this disclosure. The embodiment of the UE 116 illustrated in FIG. 3 is for illustration only, and the UEs 111-115 of FIG. 1 could have the same or similar configuration. However, UEs come in a wide variety of configurations, and FIG. 3 does not limit the scope of this disclosure to any particular implementation of a UE.

As shown in FIG. 3, the UE 116 includes an antenna 305, a radio frequency (RF) transceiver 310, TX processing circuitry 315, a microphone 320, and receive (RX) processing circuitry 325. The UE 116 also includes a speaker 330, a processor 340, an input/output (I/O) interface (IF) 345, a touchscreen 350, a display 355, and a memory 360. The memory 360 includes an operating system (OS) 361 and one or more applications 362.

The RF transceiver 310 receives, from the antenna 305, an incoming RF signal transmitted by an eNB of the network 100. The RF transceiver 310 down-converts the incoming RF signal to generate an intermediate frequency (IF) or baseband signal. The IF or baseband signal is sent to the RX processing circuitry 325, which generates a processed baseband signal by filtering, decoding, and/or digitizing the baseband or IF signal. The RX processing circuitry 325 transmits the processed baseband signal to the speaker 330 (such as for voice data) or to the processor 340 for further processing (such as for web browsing data).

The TX processing circuitry 315 receives analog or digital voice data from the microphone 320 or other outgoing baseband data (such as web data, e-mail, or interactive video game data) from the processor 340. The TX processing circuitry 315 encodes, multiplexes, and/or digitizes the outgoing baseband data to generate a processed baseband or IF signal. The RF transceiver 310 receives the outgoing processed baseband or IF signal from the TX processing circuitry 315 and up-converts the baseband or IF signal to an RF signal that is transmitted via the antenna 305.

The processor 340 can include one or more processors or other processing devices and execute the OS 361 stored in the memory 360 in order to control the overall operation of the UE 116. For example, the processor 340 could control the reception of forward channel signals and the transmission of reverse channel signals by the RF transceiver 310, the RX processing circuitry 325, and the TX processing circuitry 315 in accordance with well-known principles. In some embodiments, the processor 340 includes at least one microprocessor or microcontroller.

The processor 340 is also capable of executing other processes and programs resident in the memory 360. The processor 340 can move data into or out of the memory 360 as required by an executing process. In some embodiments, the processor 340 is configured to execute the applications 362 based on the OS 361 or in response to signals received from eNBs or an operator. The processor 340 is also coupled to the I/O interface 345, which provides the UE 116 with the ability to connect to other devices, such as laptop computers and handheld computers. The I/O interface 345 is the communication path between these accessories and the processor 340.

The processor 340 is also coupled to the touchscreen 350 and the display 355. The operator of the UE 116 can use the touchscreen 350 to enter data into the UE 116. The display 355 may be a liquid crystal display, light emitting diode display, or other display capable of rendering text and/or at least limited graphics, such as from web sites.

The memory 360 is coupled to the processor 340. Part of the memory 360 could include a random access memory (RAM), and another part of the memory 360 could include a Flash memory or other read-only memory (ROM).

As described in more detail below, the UE 116 may include circuitry and/or programming for vector quantization of feedback components such as channel coefficients. Although FIG. 3 illustrates one example of UE 116, various changes may be made to FIG. 3. For example, various components in FIG. 3 could be combined, further subdivided, or omitted and additional components could be added according to particular needs. As a particular example, the processor 340 could be divided into multiple processors, such as one or more central processing units (CPUs) and one or more graphics processing units (GPUs). Also, while FIG. 3 illustrates the UE 116 configured as a mobile telephone or smartphone, UEs could be configured to operate as other types of mobile or stationary devices.

Figure 4A:
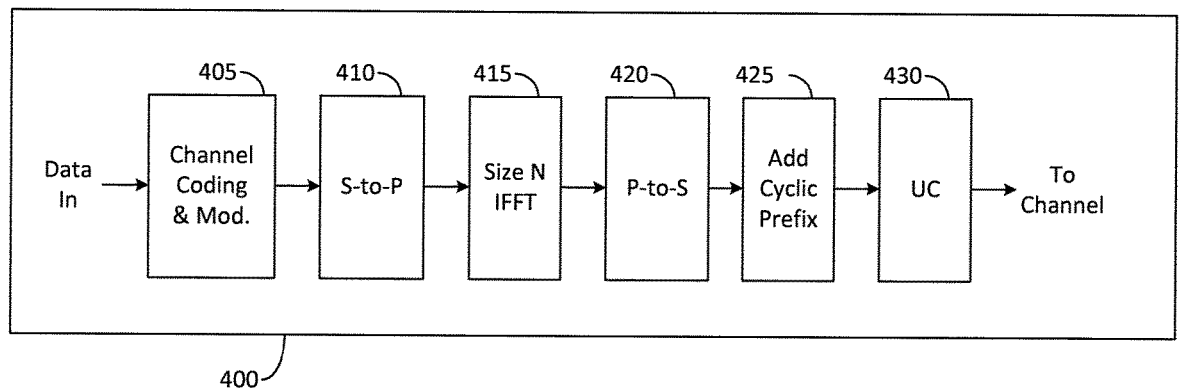
FIG. 4A illustrates a high-level diagram of an orthogonal frequency division multiple access transmit path according to illustrative embodiments of this disclosure.
Figure 4B:
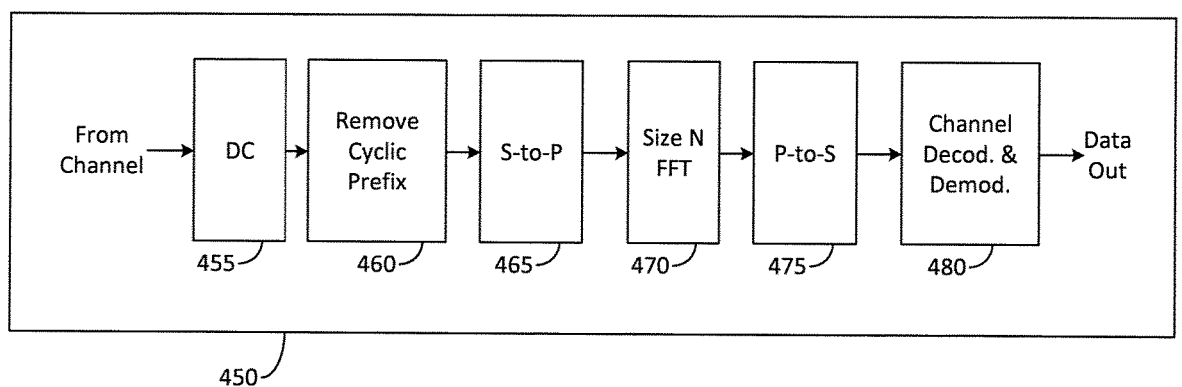
FIG. 4B illustrates a high-level diagram of an orthogonal frequency division multiple access receive path according to illustrative embodiments of this disclosure.

FIG. 4A is a high-level diagram of transmit path circuitry 400. For example, the transmit path circuitry 400 may be used for an orthogonal frequency division multiple access (OFDMA) communication. FIG. 4B is a high-level diagram of receive path circuitry 450. For example, the receive path circuitry 450 may be used for an orthogonal frequency division multiple access (OFDMA) communication. In FIGS. 4A and 4B, for downlink communication, the transmit path circuitry 400 may be implemented in a base station (eNB) 102 or a relay station, and the receive path circuitry 450 may be implemented in a user equipment (e.g. user equipment 116 of FIG. 1). In other examples, for uplink communication, the receive path circuitry 450 may be implemented in a base station (e.g. eNB 102 of FIG. 1) or a relay station, and the transmit path circuitry 400 may be implemented in a user equipment (e.g. user equipment 116 of FIG. 1).

Transmit path circuitry 400 comprises channel coding and modulation block 405, serial-to-parallel (S-to-P) block 410, Size N Inverse Fast Fourier Transform (IFFT) block 415, parallel-to-serial (P-to-S) block 420, add cyclic prefix block 425, and up-converter (UC) 430. Receive path circuitry 450 comprises down-converter (DC) 455, remove cyclic prefix block 460, serial-to-parallel (S-to-P) block 465, Size N Fast Fourier Transform (FFT) block 470, parallel-to-serial (P-to-S) block 475, and channel decoding and demodulation block 480.

At least some of the components in FIGS. 4A and 4B may be implemented in software, while other components may be implemented by configurable hardware or a mixture of software and configurable hardware. In particular, it is noted that the FFT blocks and the IFFT blocks described in this disclosure document may be implemented as configurable software algorithms, where the value of Size N may be modified according to the implementation.

Furthermore, although this disclosure is directed to an embodiment that implements the Fast Fourier Transform and the Inverse Fast Fourier Transform, this is by way of illustration only and should not be construed to limit the scope of the disclosure. It will be appreciated that in an alternate embodiment of the disclosure, the Fast Fourier Transform functions and the Inverse Fast Fourier Transform functions may easily be replaced by Discrete Fourier Transform (DFT) functions and Inverse Discrete Fourier Transform (IDFT) functions, respectively. It will be appreciated that for DFT and IDFT functions, the value of the N variable may be any integer number (i.e., 1, 4, 3, 4, etc.), while for FFT and IFFT functions, the value of the N variable may be any integer number that is a power of two (i.e., 1, 2, 4, 8, 16, etc.).

In transmit path circuitry 400, channel coding and modulation block 405 receives a set of information bits, applies coding (e.g., LDPC coding) and modulates (e.g., Quadrature Phase Shift Keying (QPSK) or Quadrature Amplitude Modulation (QAM)) the input bits to produce a sequence of frequency-domain modulation symbols. Serial-to-parallel block 410 converts (i.e., de-multiplexes) the serial modulated symbols to parallel data to produce N parallel symbol streams where N is the IFFT/FFT size used in BS 102 and UE 116. Size N IFFT block 415 then performs an IFFT operation on the N parallel symbol streams to produce time-domain output signals. Parallel-to-serial block 420 converts (i.e., multiplexes) the parallel time-domain output symbols from Size N IFFT block 415 to produce a serial time-domain signal. Add cyclic prefix block 425 then inserts a cyclic prefix to the time-domain signal. Finally, up-converter 430 modulates (i.e., up-converts) the output of add cyclic prefix block 425 to RF frequency for transmission via a wireless channel. The signal may also be filtered at baseband before conversion to RF frequency.

The transmitted RF signal arrives at UE 116 after passing through the wireless channel, and reverse operations to those at eNB 102 are performed. Down-converter 455 down-converts the received signal to baseband frequency, and remove cyclic prefix block 460 removes the cyclic prefix to produce the serial time-domain baseband signal. Serial-to-parallel block 465 converts the time-domain baseband signal to parallel time-domain signals. Size N FFT block 470 then performs an FFT algorithm to produce N parallel frequency-domain signals. Parallel-to-serial block 475 converts the parallel frequency-domain signals to a sequence of modulated data symbols. Channel decoding and demodulation block 480 demodulates and then decodes the modulated symbols to recover the original input data stream.

Each of eNBs 101-103 may implement a transmit path that is analogous to transmitting in the downlink to user equipment 111-116 and may implement a receive path that is analogous to receiving in the uplink from user equipment 111-116. Similarly, each one of user equipment 111-116 may implement a transmit path corresponding to the architecture for transmitting in the uplink to eNBs 101-103 and may implement a receive path corresponding to the architecture for receiving in the downlink from eNBs 101-103.

Various embodiments of the present disclosure provide for a high-performance, scalable (with respect to the number and geometry of transmit antennas), and flexible CSI feedback framework and structure for LTE enhancements when FD-MIMO (the use of large two-dimensional antenna arrays) is supported. To achieve high performance, more accurate CSI (in terms of quantized MIMO channel) is needed at the eNB especially for FDD scenarios. In this case, embodiments of the present disclosure recognize that the previous LTE (e.g., Rel.12) precoding framework (PMI-based feedback) may need to be replaced. Yet, embodiments of the present disclosure recognize that feeding back the quantized channel coefficients may be excessive in terms of feedback requirements.

Embodiments of the present disclosure incorporate a CSI feedback scheme for FD-MIMO where each UE reports a set of coefficients. The coefficients represent a linear combination of a small number (subset) of basis functions/vectors. This subset may be configured by the eNB. Embodiments of the present disclosure recognize that subset configuration allows reduction (dimensionality reduction) in feedback overhead.

Accordingly, embodiments of the present disclosure provide efficient quantizer designs for the above-discussed coefficients which facilitate compression (e.g., lower feedback overhead) and are based on a quantization codebook. In various embodiments, the coefficients are then quantized using a vector quantization mechanism which allows small or reduced feedback overhead. Vector quantization can be performed in either frequency or a "coefficient" domain or both. Additionally, since profiles of those coefficients (e.g., dynamic range, mean or median value, shape of cumulative distribution function) can vary depending on channel statistics and/or selection of subset of basis functions/vectors, some embodiments provide a mechanism to adapt or configure the UE coefficient quantizer as a function of the profile. Some embodiments provide for the eNB to measure or estimate at least one profile of the coefficients from the incoming feedback report from the UE of interest. As the eNB senses significant changes in the profile(s), the eNB may reconfigure the UE quantizer. Other embodiments provide for the UE to assist the eNB in measuring at least one profile of the coefficients. One example of such assistance is an additional UE feedback which informs the eNB of the parameter profile.

The CSI feedback quantization provided by embodiments of the present disclosure may be intrusive as some significant amount of additional standardization may be needed. However, as the size of antenna arrays increase, such an evolution path is eventually inevitable if high-performance FD-MIMO is a goal of the future evolution of LTE—especially in FDD scenarios.

Figure 5A:
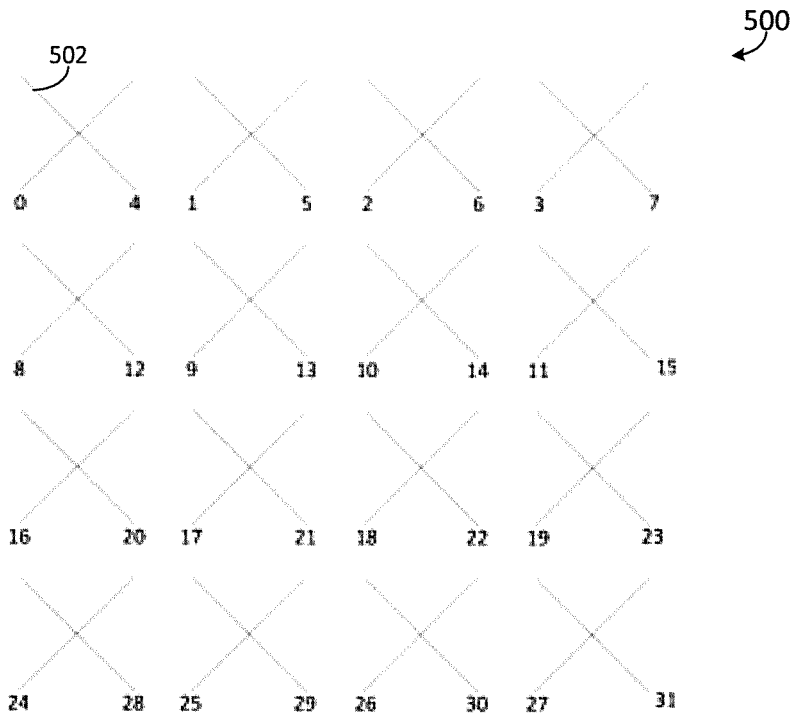
FIG. 5A illustrates an example 2D antenna array constructed from 16 dual-polarized antenna elements arranged in a 4x4 rectangular format according to an example embodiment of the present disclosure.

FIG. 5A illustrates an example 2D antenna array constructed from 16 dual-polarized antenna elements arranged in a 4×4 rectangular format according to an illustrative example. In this example, the 2D antenna array 500 is constructed from 16 dual-polarized antenna elements 502 arranged in a 4×4 rectangular format with each antenna element logically mapped onto a single antenna port. In general, one antenna port may correspond to multiple antenna elements (physical antennas) combined via a virtualization. This example 4×4 dual polarized array 500 can then be viewed as 16×2=32-element array of elements. The vertical dimension (e.g., 4 rows) facilitates elevation beamforming in addition to the azimuthal beamforming across the horizontal dimension (e.g., of 4 columns of dual polarized antennas). MIMO precoding in Rel.12 LTE standardization (e.g., per TS36.211 section 6.3.4.2, 6.3.4.4, and TS36.213 section 7.2.4) was largely designed to offer precoding gain for a one-dimensional antenna array. While fixed beamforming (e.g., antenna virtualization) can be implemented across the elevation dimension, it is unable to reap the potential gain offered by the spatial and frequency selective nature of the channel.

In Rel.12 LTE, MIMO precoding (for spatial multiplexing) can be performed either with CRS (cf. TS36.211 section 6.3.4.2) or UE-RS (cf. TS36.211 section 6.3.4.4). In either case, each UE operating in spatial multiplexing mode(s) is configured to report CSI, which may contain a precoding matrix indicator (PMI) (e.g., precoding codebook index). A PMI report may be derived from one of the following sets of standardized codebooks: i) two antenna ports {TS36.211 table 6.3.4.2.3-1}, ii) four antenna ports {TS36.211 table 6.3.4.2.3-2} or {TS36.213 table 7.2.4-0A, B, C, and D}, and iii) eight antenna ports: {TS36.213 table 7.2.4-1, 2, 3, 4, 5, 6, 7, and 8}.

If the eNB follows the UE's PMI recommendation, the eNB is expected to precode the eNB's transmitted signal according to the recommended precoding vector/matrix (for a given subframe and PRB). Regardless of whether the eNB follows the UE's recommendation, the UE is configured to report a PMI according to the above precoding codebooks. Here, a PMI (which may include a single index or a pair of indices) is associated with a precoding matrix W of size $N_c \times N_L$ where $N_c$ is the number of antenna ports in one row (=number of columns) and $N_L$ is the number of transmission layers. As the number of antenna elements increase (e.g., up to 8 rows of four dual-polarized antennas which amounts to 64 elements), significantly larger precoding codebooks are needed. In addition, as MU-MIMO becomes a dominant scheduling strategy, obtaining a good multi-user pairing from single-user PMIs (received from the active UEs) has proved to be challenging. Hence, the Rel.12 LTE CSI feedback paradigm limits the potential of FD-MIMO especially in FDD scenarios where channel reciprocity is limited to long-term channel statistics at best.

Therefore, embodiments of the present disclosure recognize that for a FD-MIMO that utilizes a 2D antenna array (hence 2D precoding), there is a need for high-performance, scalable (with respect to the number and geometry of transmit antennas), and flexible CSI feedback framework and structure. To achieve high performance, more accurate CSI (preferably in terms of quantized MIMO channel) is needed at the eNB. This is especially the case for FDD scenarios where short-term reciprocity is infeasible. In this case, embodiments of the present disclosure recognize that the previous LTE (e.g. Rel.12) precoding framework (PMI-based feedback) may need to be replaced. Yet feeding back the quantized channel coefficients may be excessive in terms of feedback requirements. Embodiments of the present disclosure incorporate a CSI feedback scheme for FD-MIMO where each UE reports a set of coefficients. The coefficients represent a linear combination of a small number (subset) of basis functions/vectors. This is possible for UEs with lower mobility as the angle-of-departure (AoD) spread is sufficiently small for a given time period. This subset is configured by the eNB. Subset configuration allows reduction (dimensionality reduction) in feedback overhead.

For the CSI feedback scheme for FD-MIMO where each UE reports a set of coefficients, given $N_c$ columns and $N_r$ rows of the 2D array, the $N_r \times N_c$ DL channel $H^{(q,f)}$ associated with the received signal at the UE can be expressed as follows (for the q-th receive antenna, f-th frequency sub-band, and a given polarization), can be represented as a linear combination of basis $\{A(\phi_k, \theta_l)\}$ associated with a set of discrete AoDs $\tilde{\Gamma} = \{(\phi_k, \theta_l)\}$:

$$H^{(q,f)} \cong \sum_{(\phi_k, \theta_l) \in \tilde{\Gamma}} c_{k,l}^{(q,f)} A(\phi_k, \theta_l) \quad \text{(Equation 1)}$$

where $\tilde{\Gamma} = \{(\phi_k, \theta_l)\}$ is chosen as a subset of the "master-set."

While there are various choices of $A(\phi_k, \theta_l)$, one example is to use uniform sampling in phase domain which facilitates a DFT-based implementation. In this example, equation 1 may expressed as:

$$H^{(q,f)} \cong \sum_{(k,l) \in \tilde{\Gamma}} c_{k,l}^{(q,f)} B_{k,l} \quad \text{(Equation 2)}$$

where $$B_{k,l} = \frac{1}{\sqrt{N_r N_c}} \times \begin{bmatrix} 1 \\ e^{-j\frac{2\pi l}{\Delta_r N_r}} \\ \vdots \\ e^{-j(N_r - 1)\frac{2\pi l}{\Delta_r N_r}} \end{bmatrix} \times \begin{bmatrix} 1 \\ e^{-j\frac{2\pi k}{\Delta_c N_c}} \\ \vdots \\ e^{-j(N_c - 1)\frac{2\pi k}{\Delta_c N_c}} \end{bmatrix} \quad \text{(Equation 3)}$$

where $\tilde{\Gamma}$ denotes the set of indices associated with the subset of phase values which covers the angular cone(s). Likewise, $\Delta_r$ and $\Delta_c$ in (6) are oversampling factors (with 1 as a special case of non-overlapping DFT beams) which produce overlapping DFT beams.

In this example case, the "master-set" corresponds to the following:

$$l = 0, 1, \ldots, \frac{\Delta_r N_r}{2} - 1, \quad \text{(Equation 4)}$$
$$k = 0, 1, \ldots, \Delta_c N_c - 1$$

when $|\tilde{\Gamma}| \ll N_r N_c$, dimensionality reduction is achieved. While there are various ways to compute the coefficients, one example embodiment is to use a least-square solution. Another example is to quantize channel eigenvector(s) instead of the channel itself where the same procedure discussed-above applies.

Figure 5B:
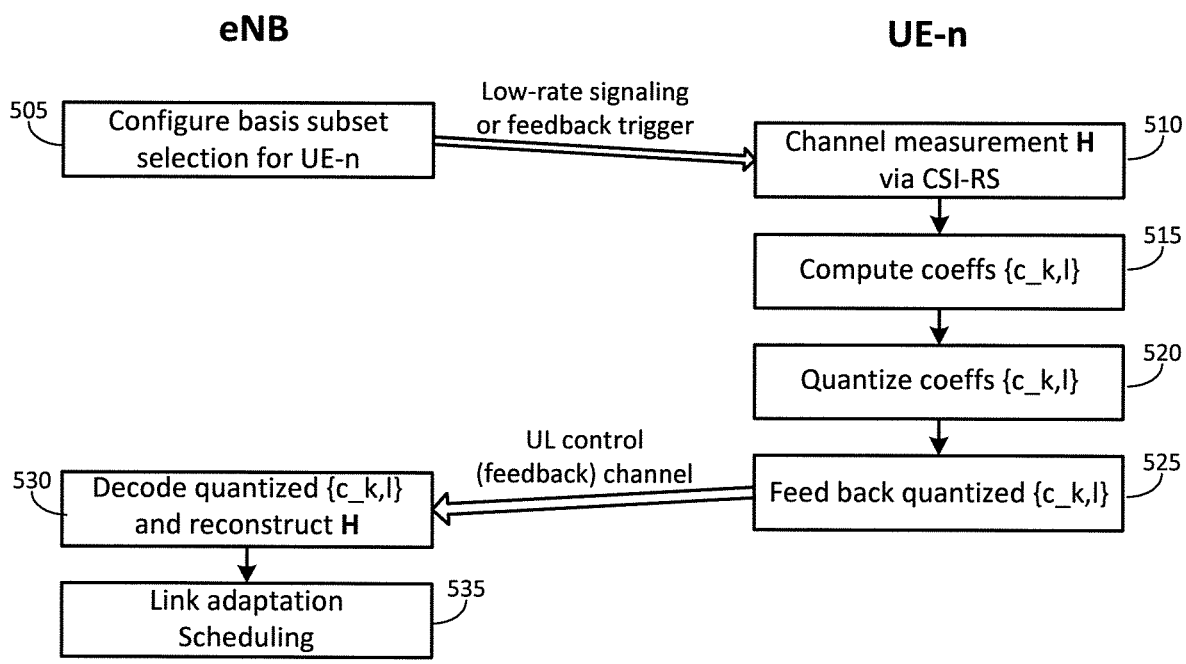
FIG. 5B illustrates an example signal flow and process diagram facilitating UE CSI feedback according to embodiments of the present disclosure.

FIG. 5B illustrates an example signal flow and process diagram facilitating UE CSI feedback according to embodiments of the present disclosure. For example, the process may be performed by the eNB 102 and the UE 116 in FIG. 1. Processing the SRS from a UE, eNB derives its preferred basis vector set $B_{\tilde{\Gamma}}$, for the UE, and eNB configures the basis vector set for the UE via a low-rate signaling or feedback trigger procedure (505). For CSI feedback, eNB configures CSI-RS for a UE. UE measures channels H using the configured CSI-RS (510) and then computes the channel coefficients corresponding to the configured basis vector set (515). UE then quantizes the channel coefficients (520) and feeds the quantized coefficients to the eNB in the CSI report (525). The eNB decodes the quantized channel coefficients and reconstructs the channel according to the configured basis vector set (530) for operations such as scheduling and link adaptation (535).

Figure 5C:
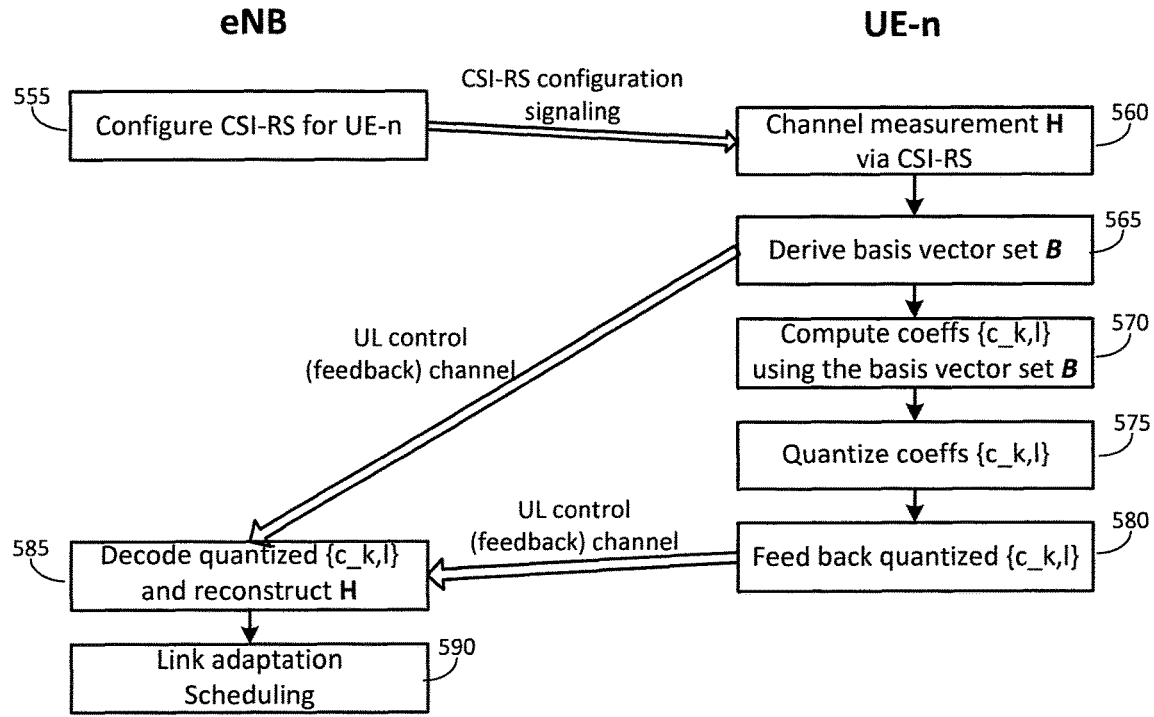
FIG. 5C illustrates another example signal flow and process diagram facilitating UE CSI feedback according to embodiments of the present disclosure.

FIG. 5C illustrates another example signal flow and process diagram facilitating UE CSI feedback according to embodiments of the present disclosure. For example, the process may be performed by the eNB 102 and the UE 116 in FIG. 1. The eNB first configures CSI-RS for a UE (555). Then, the UE estimates channels with configured CSI-RS and processes the channel estimates (560). The UE derives a basis vector set using the channel estimates (565). The basis vectors in the basis vector set may be selected from a master set. The UE then computes the channel coefficients corresponding to the configured basis vector set (570). UE quantizes the channel coefficients (575) and feeds back information on the basis vectors and quantized coefficients to the eNB (580). The eNB decodes the quantized channel coefficients and reconstructs the channel according to the configured basis vector set (585) for operations such as scheduling and link adaptation (590).

Various embodiments of the present disclosure focus on the quantizer of the coefficients $\{c_{k,l}^{(q,f)}\}$ in 520 and 575 as discussed in greater detail below. U.S. application Ser. No. 14/593,711 entitled "CHANNEL STATE INFORMATION REPORTING WITH BASIS EXPANSION FOR ADVANCED WIRELESS COMMUNICATIONS SYSTEMS" filed Jan. 9, 2015 provides additional information about the CSI feedback scheme for FD-MIMO where each UE reports a set of coefficients. The content of U.S. application Ser. No. 14/593,711 is incorporated by reference herein.

Various embodiments of the present disclosure provide a quantizer design. Given the coefficients $\{c_{k,l}^{(q,f)}\}$, the simplest quantizer is scalar quantizer where each $c_{k,l}^{(q,f)}$ is separately quantized using, e.g. Gaussian codebook or scalar Lloyd-based quantizer. Although simple, embodiments of the present disclosure recognize that a scalar quantizer tends to be inefficient by not exploiting correlation or dependency between samples and achieving only integer bits per sample compression, and hence results in excessive feedback overhead in order to guarantee a desired quantization performance. For efficient quantization, embodiments of the present disclosure provide a vector quantizer (VQ) to exploit the correlation between samples and achieve fractional bits per sample compression.

Figure 6:
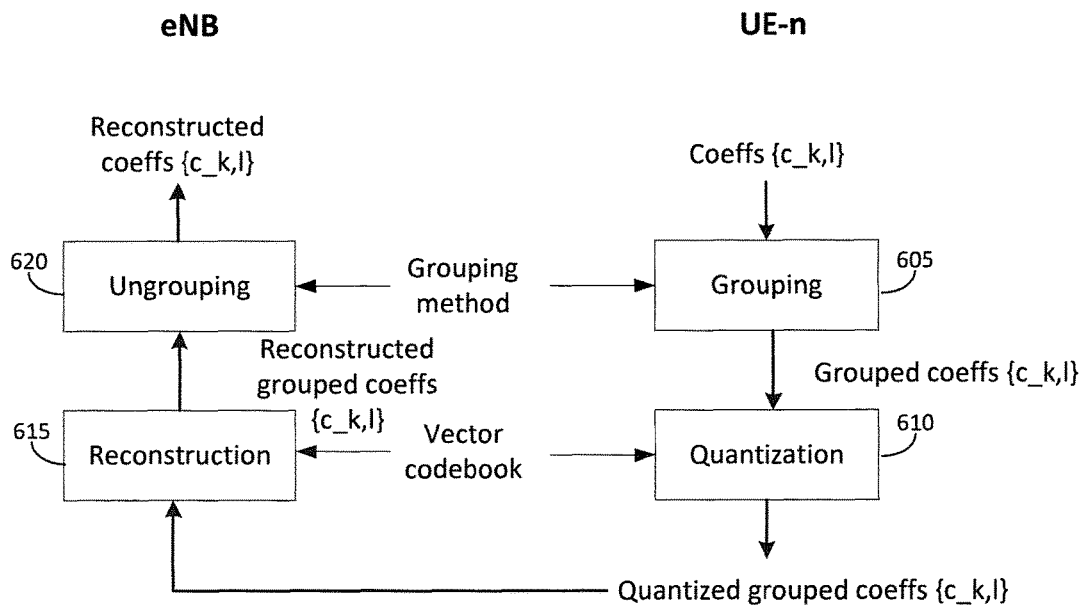
FIG. 6 illustrates an example signal flow and process diagram for vector quantization and the reconstruction according to embodiments of the present disclosure.

FIG. 6 illustrates an example signal flow and process diagram for vector quantization and the reconstruction according to embodiments of the present disclosure. For example, the process may be performed by the eNB 102 and the UE 116 in FIG. 1. The UE measures the channel to identify the channel coefficients and groups a set of scalar (real- or complex-valued) channel coefficients to form a vector at block 605. The UE then performs quantization of each vector based on a given quantization codebook at block 610. For example, a vector in the codebook (e.g., a codebook vector) is chosen to represent the coefficient vector (e.g., concatenating $\{c_{k,l}^{(q,f)}\}$ into one vector) of interest. For example, if V is the grouping length, S is the vector codebook size, and B is the number of bits per sample associated with the VQ, then they satisfy $$B = \frac{\lceil \log_2 S \rceil}{V}.$$

For a fixed value of B, larger grouping length (V), which implies larger codebook size, implies a higher codebook search complexity for the UE. Larger grouping may require more bits to index an element in the codebook because the codebook size may be increased as the grouping length is increased. However, if the grouping length is carefully chosen, the total number of bits (which amounts to feedback overhead) is lower than that of scalar quantizers. This is due to the reason that the number of bits per sample (B) to achieve a target quantization performance in the VQ can be much lower than scalar quantizers because of inherent dependencies between samples.

The reconstruction procedure performed by the eNB upon receipt of the quantized grouped coefficients received as feedback from the UE is the reverse of the quantization procedure. The eNB performs reconstruction of quantized channel coefficients using the same vector codebook that was used for vector quantization at block 615. The eNB then ungroups reconstructed quantized channel coefficients at block 620 by following the reverse of the grouping method that was used to group channel coefficients.

For a given reporting instance, per UE receive antenna or per precoding vector comprising a precoding matrix (when quantization is applied to channel coefficients), there are two dimensions that can be exploited for grouping/ungrouping methods: 1) frequency (sub-carriers), and 2) coefficients for the basis vectors.

FIGS. 7-11 illustrate examples of grouping methods in accordance with various embodiments of the present disclosure. The illustrated examples are for the purpose of providing examples and are not limiting on the different types of grouping methods that may be employed in accordance with the present disclosure. Variations and combinations of the same theme may be used. In these examples, the grouping is indicated by the rectangles.

Figure 8:
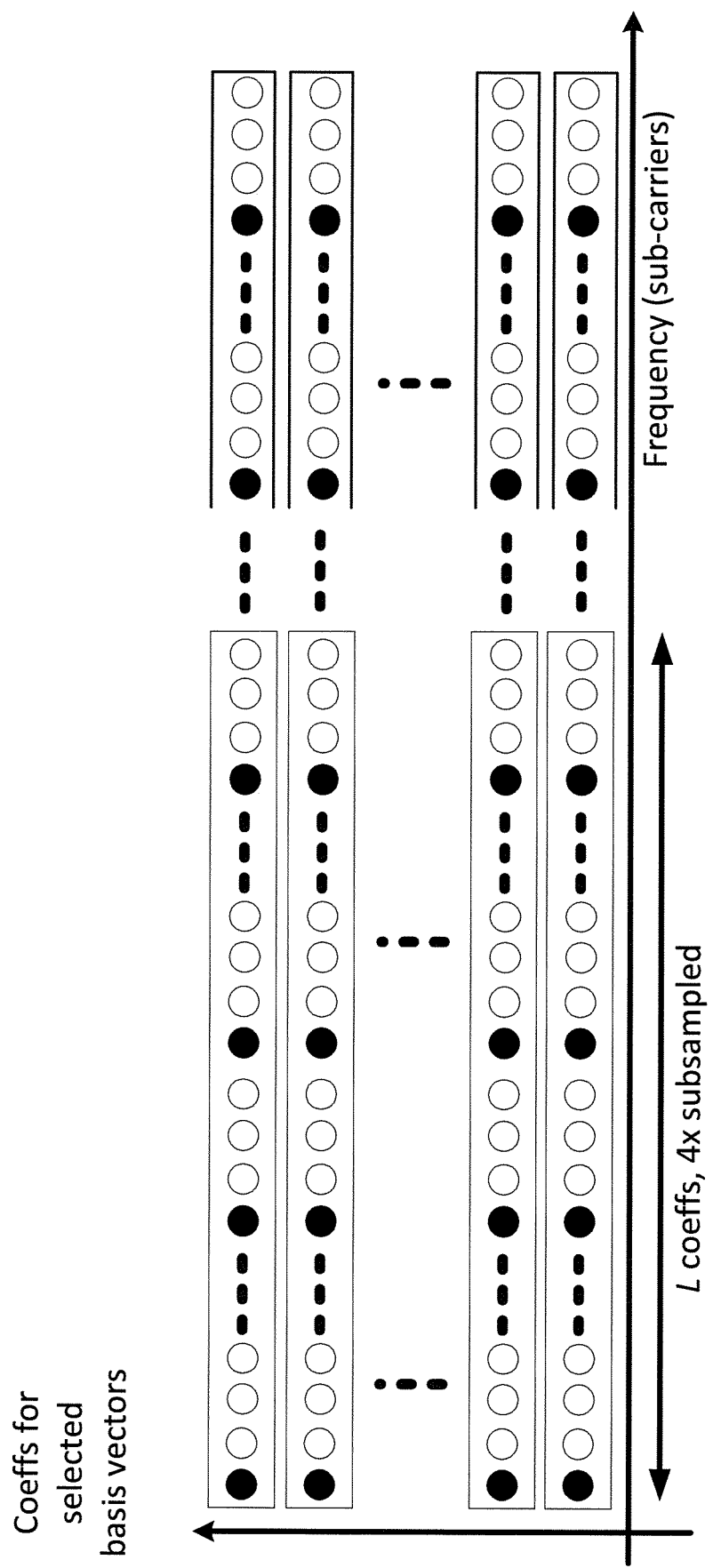
Figure 11:
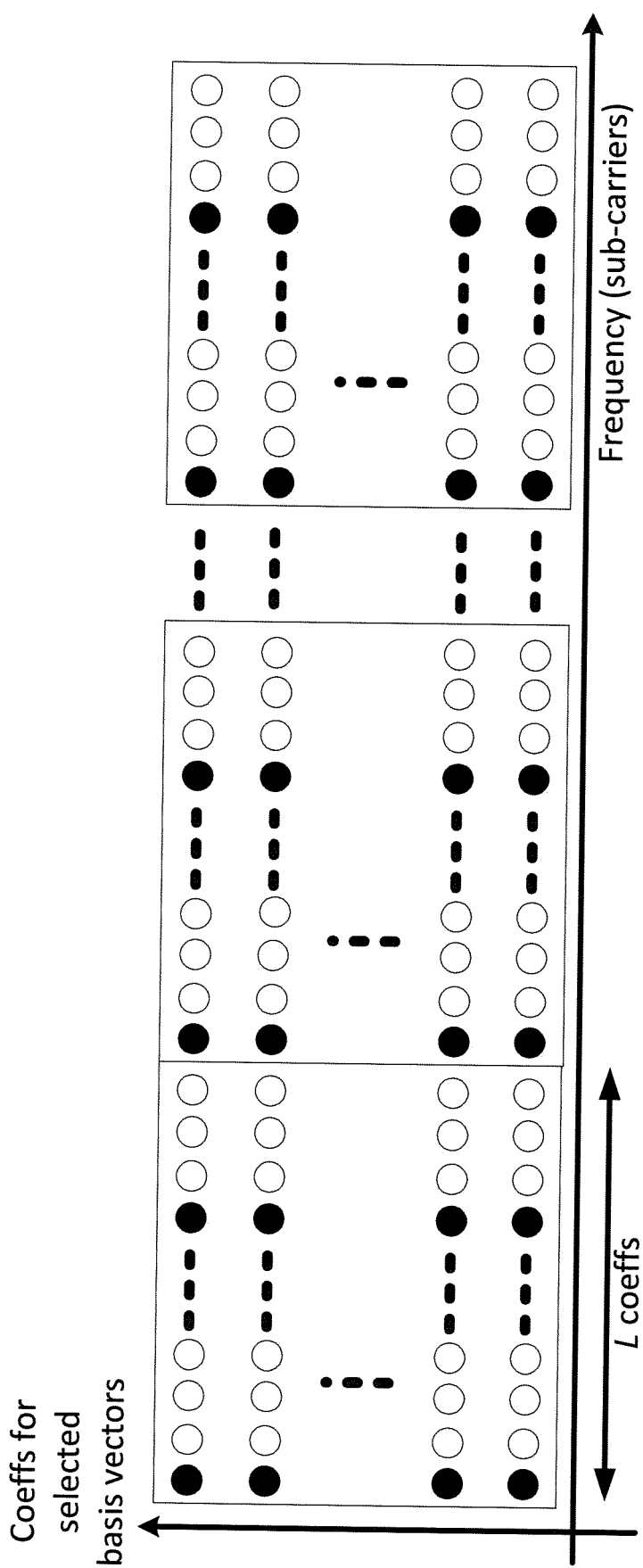

To reduce UE computational complexity, the UE may use only a subsampled set of sub-carriers. This example is illustrated in FIGS. 8 and 11 where the utilized subcarriers are indicated as filled in (i.e., black). For a given grouping length, this subsampling amounts to smaller quantization codebook. At the eNB, filtering or interpolation is applied to obtain coefficients at all subcarriers using the reconstructed quantized coefficients at sub-sampled subcarriers. Embodiments of the present disclosure may also perform grouping across receive antennas. However, this may offer little compression gain, if any, since channels associated with different receive antennas tend to be weakly correlated.

In some embodiments, the complex channel coefficients are quantized using a complex VQ. In some other embodiments, the real and imaginary components of the complex channel coefficients are separated and are quantized using a real VQ. For a real VQ, the real and imaginary components of channel coefficients may be quantized separately (not mixed in a group); for example, grouping may consist of either consecutive real components or consecutive imaginary components. Alternatively, the real and imaginary components of channel coefficients may be mixed in a group; for example, the real and imaginary components of a coefficient are placed adjacently in the same group. In yet another grouping method, the real and imaginary components are grouped according to a pre-defined permutation pattern or orderings. In practice, eNB selects the grouping method to exploit the correlation between coefficients maximally, thereby minimizing or reducing vector codebook size and feedback overhead. The exact grouping method and the corresponding VQ is the same at both at the UE and eNB. This may be configured by the eNB together with the basis set configuration and may also be dependent on the UE's capability.

Figure 7:
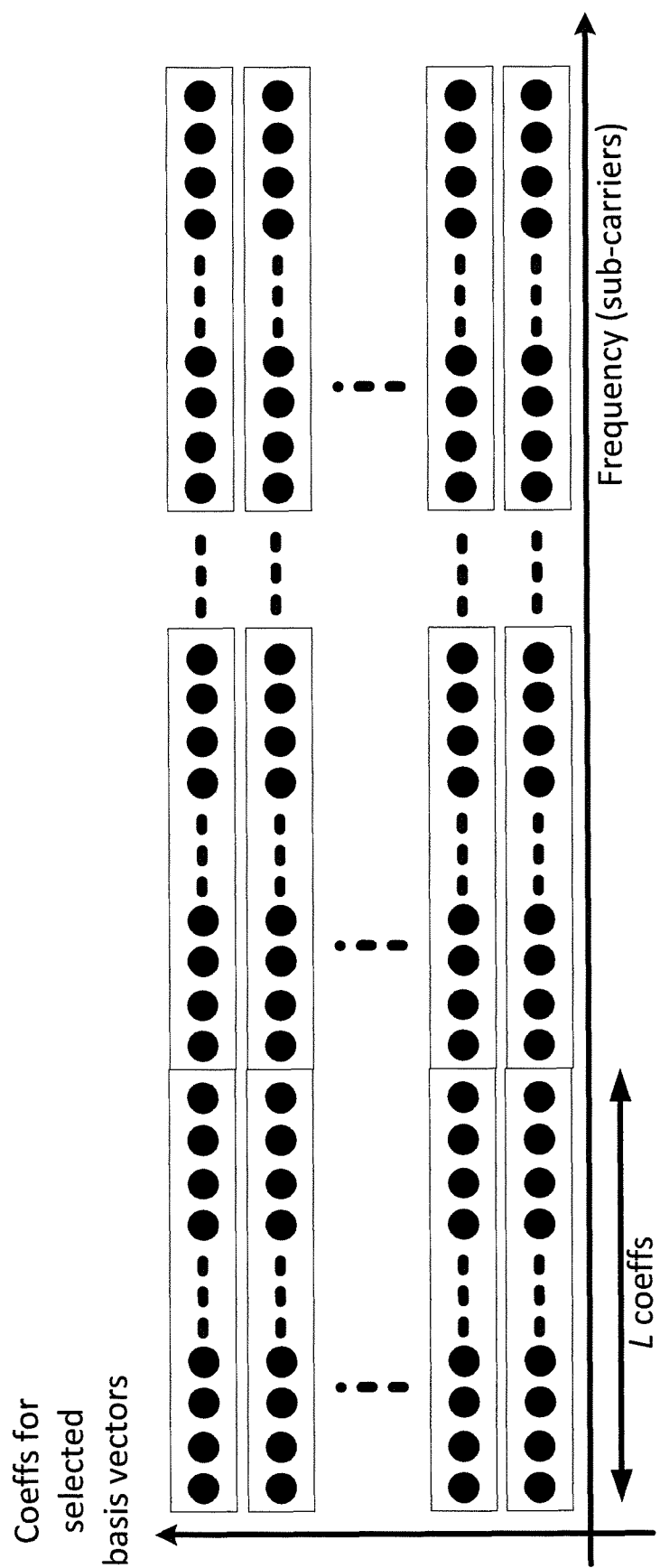
FIGS. 7-11 illustrate examples of grouping methods in accordance with various embodiments of the present disclosure.

FIG. 7 illustrates an example grouping method in a frequency (sub-carriers) domain in which coefficients are grouped separately in blocks of L consecutive sub-carriers. FIG. 8 illustrates another example of separate coefficient grouping in frequency domain in which subsampling by 4 times is applied before grouping. In this example, filled in (i.e., black) circles represent subsampled coefficients.

Figure 9:
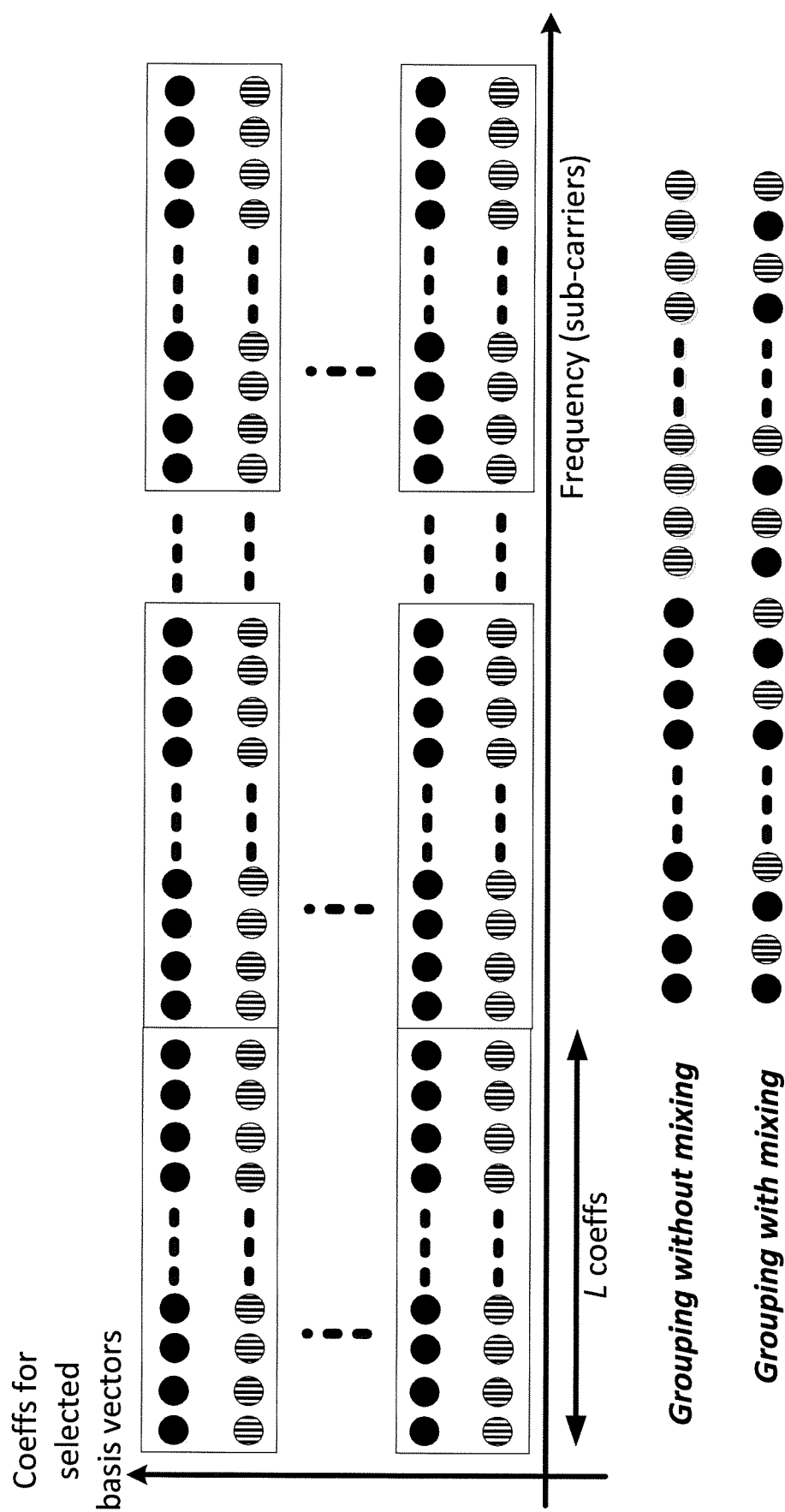
Figure 10:
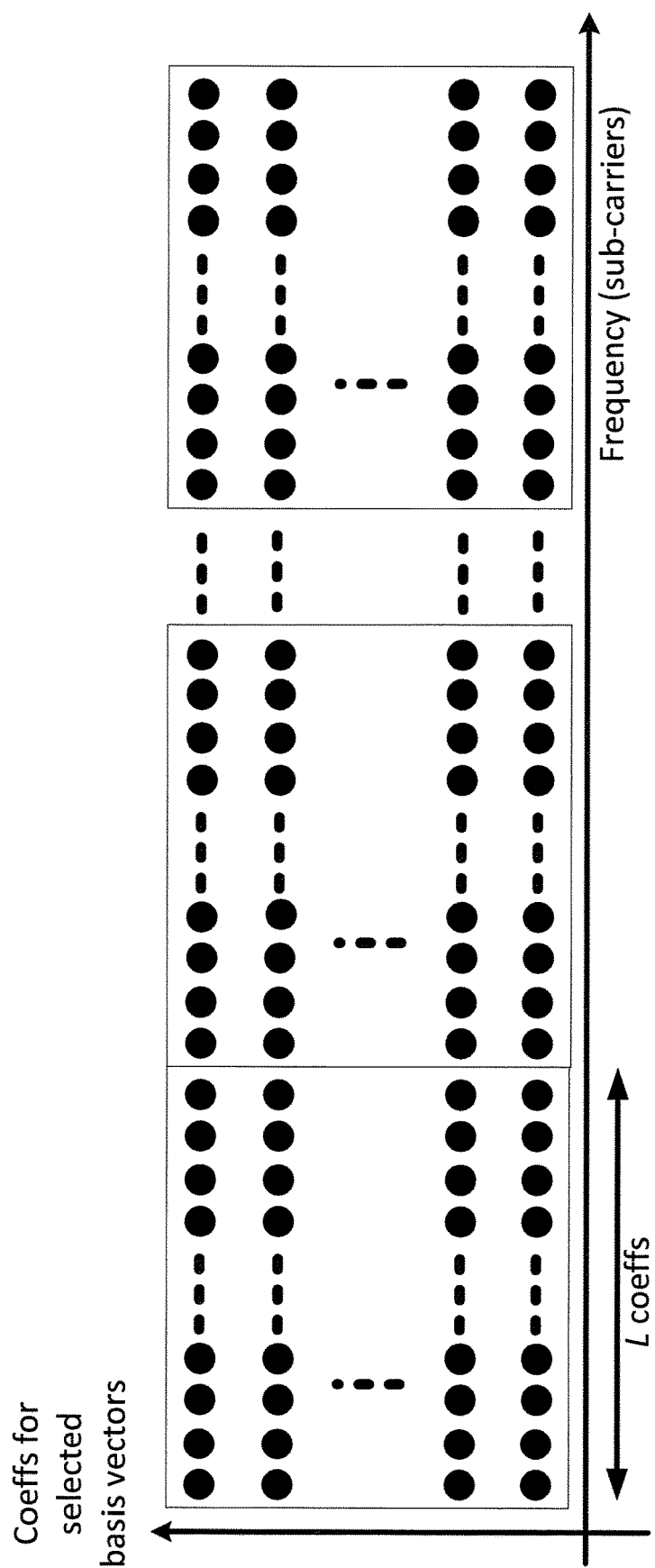

FIG. 9 illustrates an example grouping method in which two consecutive linear-combination coefficients and L consecutive sub-carriers are grouped in one block. In one grouping method, L sub-carriers corresponding to the two linear-combination coefficients are not mixed, i.e., form the two parts of the group. In grouping another method, the two are mixed; for example—the two coefficients corresponding to the same subcarrier are placed next to each other. FIG. 10 illustrates an example grouping method similar to the example illustrated in FIG. 9 in which one block includes all linear-combination coefficients.

FIG. 11 illustrates another example in which all linear-combination coefficients are considered in the grouping, and subsampling by 4 times is applied prior to grouping. In operation, statistical profiles of those coefficients (e.g., dynamic range, mean or median value, covariance, other higher moments, shape of cumulative distribution function) vary depending on channel statistics and/or selection of subset of basis functions/vectors. Therefore, a fixed grouping method and associated vector quantization codebook may not provide sufficient quantization precision. Accordingly, embodiments of the present disclosure provide multiple grouping methods and quantization codebooks and selection among such grouping methods and quantization codebooks.

Figure 12:
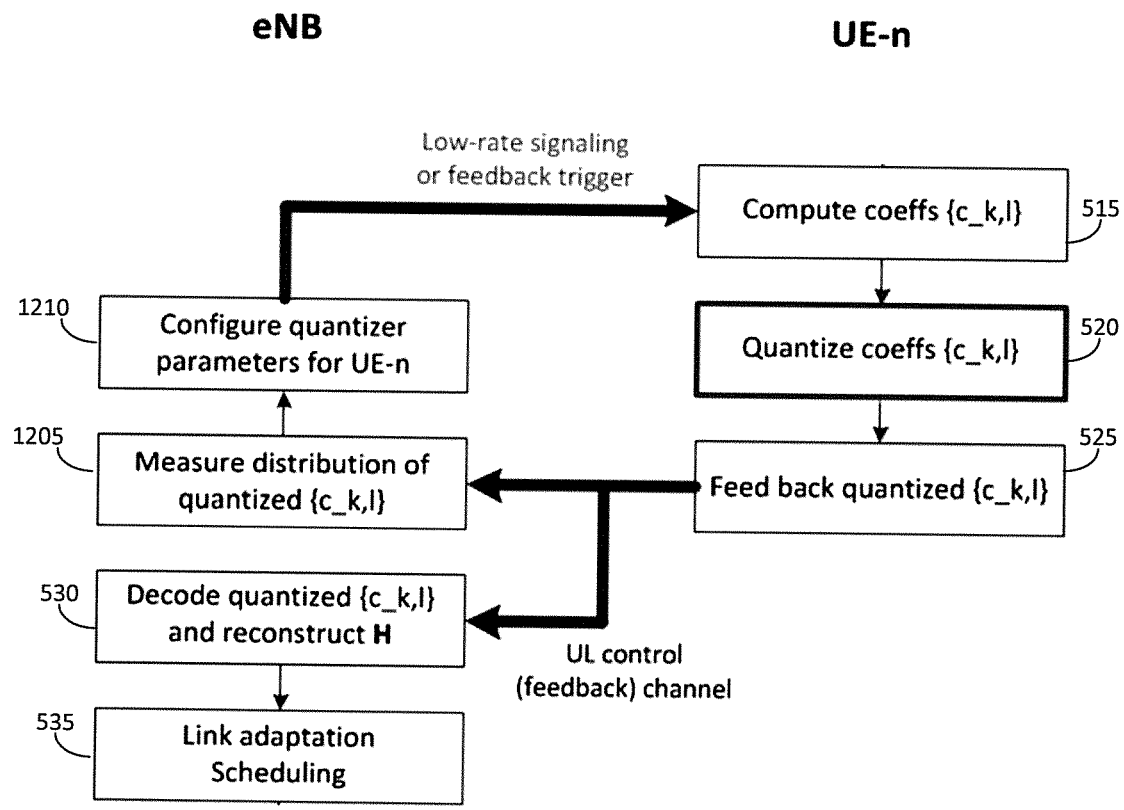
FIG. 12 illustrates an example of a signal flow and process diagram for an eNB configured quantizer according to embodiments of the present disclosure.

FIG. 12 illustrates an example of a signal flow and process diagram for an eNB configured quantizer according to embodiments of the present disclosure. For example, the process may be performed by the eNB 102 and the UE 116 in FIG. 1. Various embodiments of the present disclosure provide a mechanism to adapt or configure the UE coefficient quantizer as a function of a profile of the channel coefficients.

In this example embodiment, the UE computes, quantizes, and feeds back the channel coefficients; then, the eNB decodes, reconstructs, and performs link and adaptation scheduling, for example as discussed above with regard to FIGS. 5A and 5B. Additionally, in this embodiment, the eNB measures or estimates at least one profile of coefficients of interest from the incoming feedback report from the UE (1205). As the eNB senses changes in the profile(s), the eNB may reconfigure parameters for the UE quantizer (1210) and send at least one control signal to the UE indicating the reconfigured quantizer parameters. The UE then uses the updated and reconfigured parameters for future quantization feedback cycles, and the process may be performed recursively. In another example, the UE may assist the eNB in measuring at least one profile of the coefficients. For example, the UE may provide an additional feedback to inform the eNB of the parameter profile.

As illustrated in 1205, the eNB measures the distribution of quantized coefficients $\{c_{k,l}^{(q,f)}\}$ either itself or based on the UE feedback and uses the distribution to configure the quantizer parameters, such as, for example, the VQ index from a set of multiple VQs and the grouping method to construct vectors for quantization.

In various embodiments, the eNB configures at least one grouping method and at least one vector codebook for a UE. In one example, the eNB configures one grouping method and a single codebook. The UE derives coefficients using the configured grouping method and the codebook. In another example, the eNB configures multiple grouping methods but a single common codebook. The UE selects one preferred grouping method for the CSI report, which gives best quantization of the channel coefficients. The UE then uses the codebook to quantize the channel coefficients using the selected grouping method. In this example, the UE feeds back the selected grouping method index together with the quantized linear-combination coefficients.

In another example, eNB configures multiple vector codebooks but a single grouping method. The UE selects one preferred vector codebook for the CSI report, which gives best quantization of the channel coefficients. The UE then uses the selected vector codebook and the configured grouping method to quantize the channel coefficients. In this example, the UE feeds back the selected vector codebook index together with the quantized linear-combination coefficients. In another example, the eNB configures multiple grouping methods and multiple vector codebooks. The UE selects one preferred vector codebook and one preferred grouping method for the CSI report, which gives best quantization of the channel coefficients. The UE then uses the selected vector codebook and grouping method to quantize the channel coefficients. In this example, the UE feeds back the selected vector codebook and grouping method indices together with the quantized linear-combination coefficients.

In some example embodiments, eNB may configure codebook adaptation to the UE. An example of such signaling is shown in table below, where 0 indicates no adaptation, and 1 indicates adaptation.

| Method | Grouping adaptation | VQ adaptation |
| --- | --- | --- |
| 1 | 0 | 0 |
| 2 | 0 | 1 |
| 3 | 1 | 0 |
| 4 | 1 | 1 |

In some example embodiments, the at least one estimated profile of the channel coefficients according to embodiments of this present disclosure is used to select one of the possible configurations for the vector codebook and grouping method for a UE.

In some example embodiments, the selection of a grouping method from a plurality of grouping methods is based on average correlation between the grouped channel coefficients. For instance, the grouping method which has a maximum or increased correlation is selected.

In some example embodiments, the selection of a grouping method from a plurality of grouping methods is based on entropy function of the distribution of grouped channel coefficients. For instance, the grouping method which has a minimum or decreased entropy may be selected.

In some example embodiments, the selection of a grouping method from a plurality of grouping methods is based on the target quality or resolution. For some UEs, the target quality may be higher and for some it may be lower. Depending of the target quality of different UEs, the UEs are configured with the grouping methods.

In some example embodiments, the UE may start the quantization procedure (e.g., as illustrated in FIG. 6) with a fixed (default or universal) grouping method and vector codebook that are adapted depending on the eNB configuration according to some embodiments of this present disclosure. For instance, the default grouping method may be vector quantization of consecutive real or consecutive imaginary components of channel coefficients (without mixing) in frequency domain (e.g., as illustrated in FIG. 9), and the default vector codebook may be a vector Gaussian codebook.

In some example embodiments, the UE communicates to the eNB about the UE's capabilities, for example, such as codebook search. Based on the UE capability and estimated profile, the eNB configures a suitable grouping method and a vector codebook to the UE.

In some example embodiments, there may be additional semi-static signaling between eNB and UE to signal quantizer parameters, grouping methods, and other information for efficient quantization. For example, this signaling may include a scaling parameter to control the dynamic range of the coefficients, a mean and covariance to transform the channel coefficients to zero-mean and unit-variance, higher moments to select the channel coefficient distribution, and a corresponding vector quantization codebook.

In one or more embodiments discussed above, it may be assumed that the codewords of the vector codebook are represented by a fixed-length binary sequence. This representation may be optimal if the distribution of codewords is uniform. If the distribution is not uniform, then embodiments of the present disclosure may apply a lossless compression scheme, such as entropy coding, to obtain variable-length codewords which reduces the number of feedback bits on average.

Figure 13:
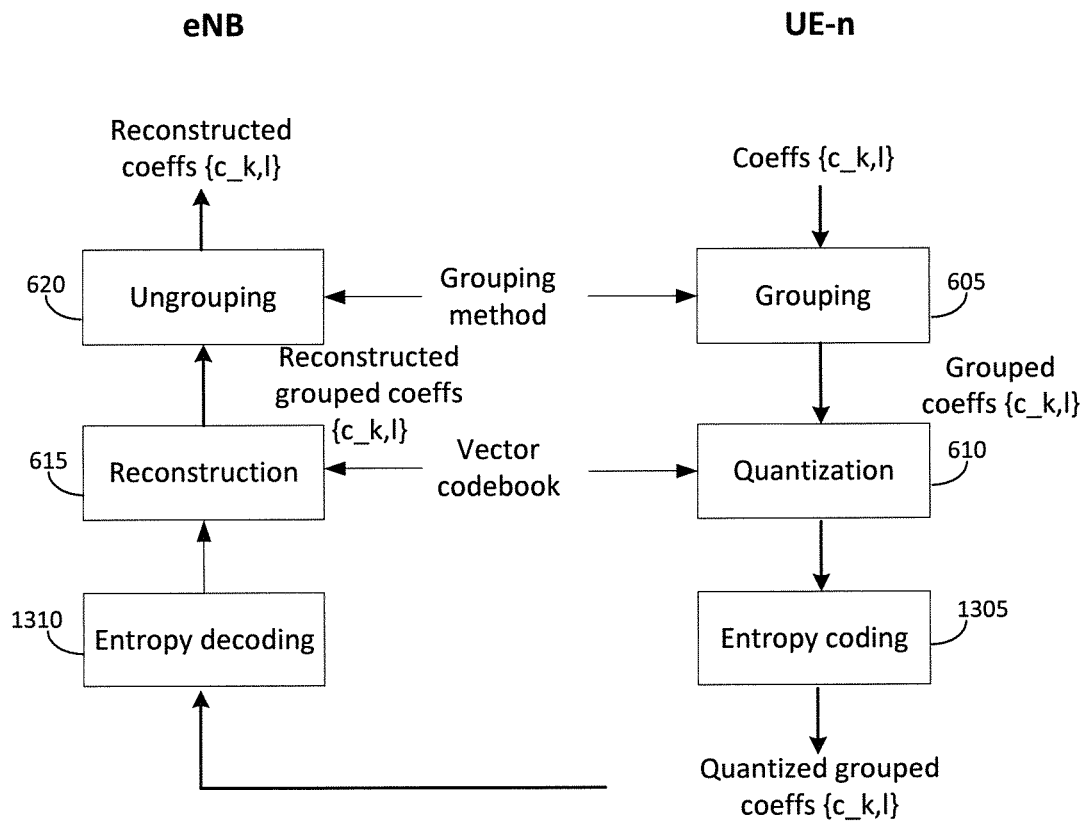
FIG. 13 illustrates an example signal flow and process diagram for quantization and reconstruction with entropy coding and decoding according to embodiments of the present disclosure.

FIG. 13 illustrates an example signal flow and process diagram for quantization and reconstruction with entropy coding and decoding according to embodiments of the present disclosure. For example, FIG. 13 illustrates an example of entropy coding and decoding applied to the vector quantization and the reconstruction process illustrated in FIG. 6. In addition to the quantization and the reconstruction process discussed above with respect to FIG. 6, in this example embodiment, the UE applies lossless variable-length compression, such as, for example, entropy coding after vector quantization (1305) and the eNB applies decompression before reconstruction (1310) after receipt of the compressed feedback.

In some example embodiments, a group includes multiple subgroups where a subgroup includes multiple coefficients (e.g., in a different time and frequency grid, such as a resource block). A coefficient that can best represent a subgroup is first selected, e.g., by means of calculating average or the maximum absolute value in the subgroup. Then, the UE performs vector quantization of a set of selected or "best" coefficients. This implementation has low-complexity as the channel coefficients are first compressed into a smaller representation before feeding into the VQ and may be advantageous if channel coefficients manifest correlation in time and frequency domain, which is often the case in a cellular network.

In some example embodiments, the UE uses DFT vectors to quantize a set of spatial coefficients with the same polarization, and a single co-phasing factor is used to characterize the relation between two polarizations.

Figure 14:
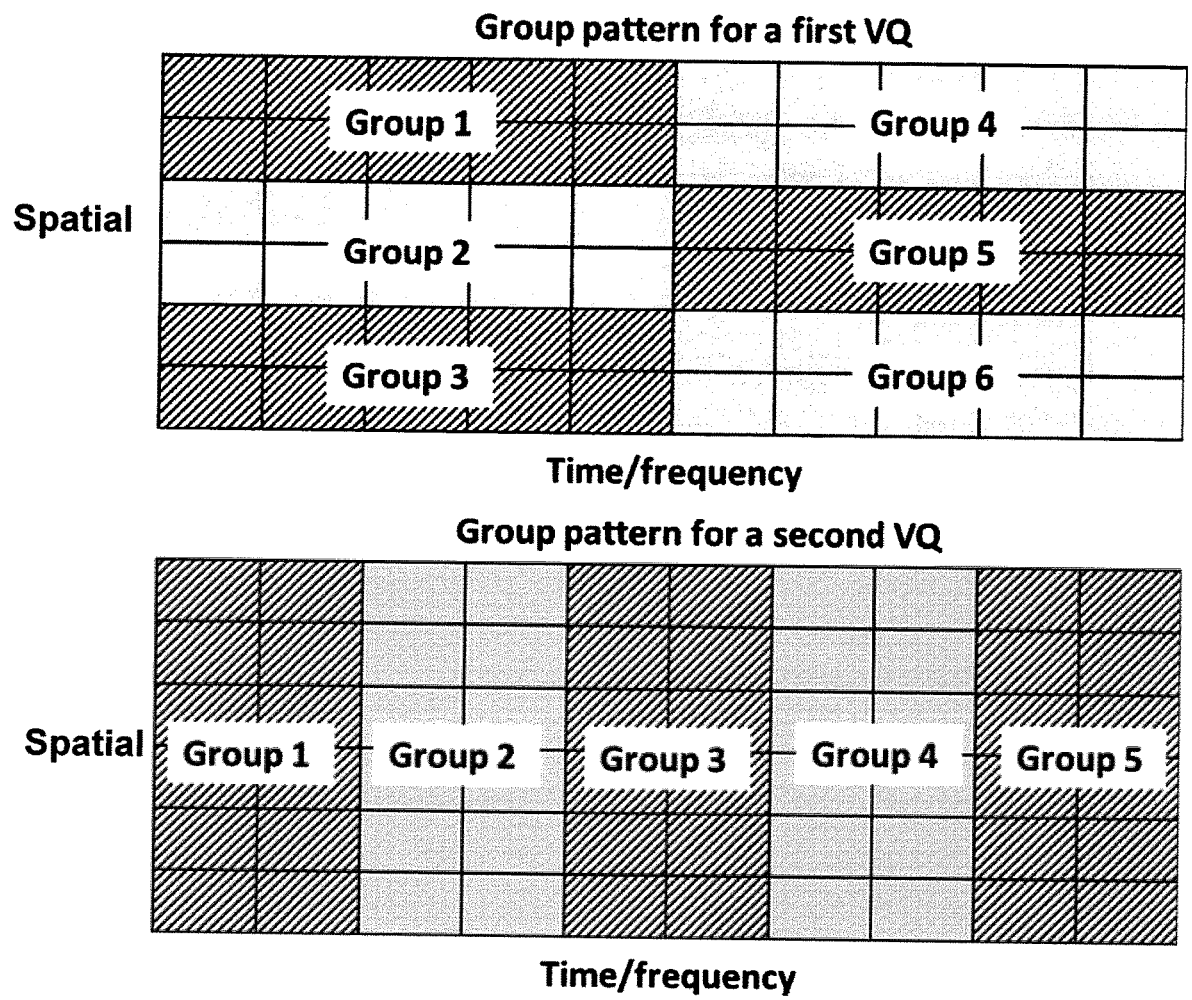
FIG. 14 illustrates an example diagram of a multi-level vector quantizer according to embodiments of the present disclosure.

FIG. 14 illustrates an example diagram of a multi-level vector quantizer according to embodiments of the present disclosure. In these example embodiments, the UE performs at least two types of vector quantization. This allows the VQ in the UE to exploit a different level of correlations within the channel. In one example, the UE uses a first VQ to quantize each subgroup, resulting in a quantization vector comprising the quantization indices out of all the subgroups. Then, the UE uses a second VQ to quantize the quantization vector.

In another example, the UE uses a first VQ to quantize each subgroup, resulting in a quantization vector comprising the quantization indices out of all the subgroups. Then, UE codes the quantization indices differently coded to construct a CSI feedback report. In another example, the UE uses a first VQ to quantize a subgroup and a second VQ to quantize the vector's coefficient that is an inner product of the VQ output in the subgroup quantization using the first VQ.

In another example, as illustrated in FIGS. 7-11, the UE uses a first VQ quantize each group in each rectangle and a second VQ quantize across multiple rectangles. In another example, the groups that the two VQs quantize may or may not overlap. In another example, the UE uses a first VQ to quantize according to the groups in the rectangles illustrated in FIG. 7, and the UE uses a second VQ to quantize according to the groups in the rectangles illustrated in FIG. 8. Then, instead of feeding back two VQ results, the second VQ is quantized in a differential way, as illustrated, for example, in FIG. 14.

Figure 15:
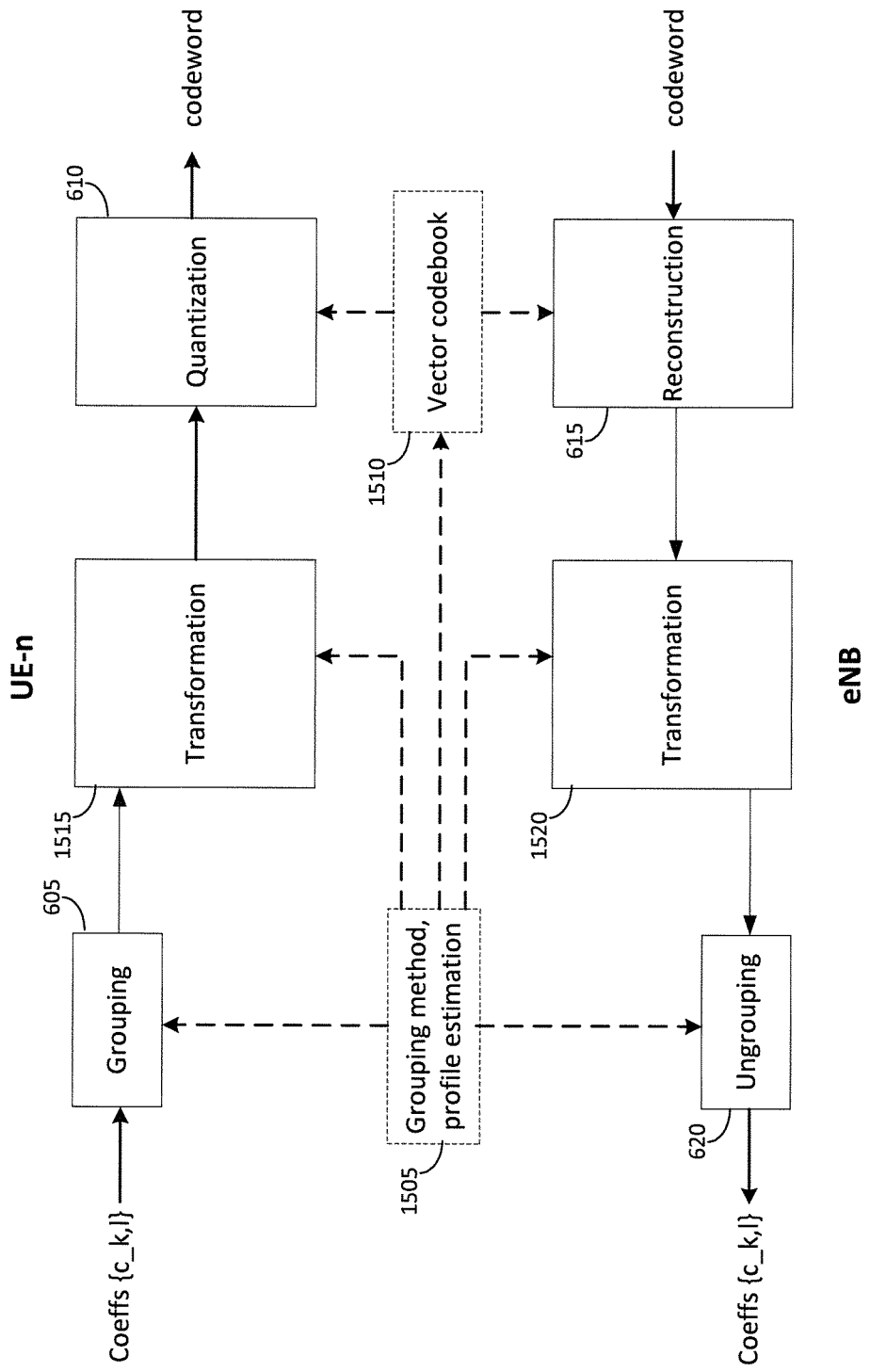
FIG. 15 illustrates an example of high level communication for vector codebook adaptation according to various embodiments of the present disclosure.

FIG. 15 illustrates an example of high level communication for vector codebook adaptation according to various embodiments of the present disclosure. In this illustrative example, FIG. 15 is an example of one implementation of the vector quantization and the reconstruction illustrated in FIG. 6 with vector codebook adaptation. In various embodiments, for efficient vector quantization of channel coefficients, it is necessary to adapt the grouping method or/and vector codebook. This adaptation requires additional communication between eNB and UE, a high-level illustration of which is illustrated by the dashed blocks and lines in FIG. 15. Based on the actual or quantized channel coefficients, for example, over multiple subframes, grouping methods, or profile estimation block 1505 outputs the selected or "best" grouping method for the grouping of channel coefficients, the relevant profiles for processing of grouped channel coefficients at eNB and UE, and the parameters for vector codebook to be used at eNB and UE. For example, the eNB may estimate the profile(s) of the channel coefficients and signal the grouping method and parameters for the vector codebook to the UE or vice versa. Upon reception of the parameters, the vector quantization block 1510 identifies the vector codebook for quantization and reconstruction at UE and eNB, respectively.

The grouping, ungrouping, quantization, and reconstruction may be performed as discussed above with regard to FIG. 6. In this example embodiment, UE and eNB each include transformation blocks 1515 and 1520, respectively, to facilitate any necessary processing on vectors before quantization and after reconstruction, respectively. The specific transformation of these vectors depends on the vector codebook. Some example transformations are discussed in greater detail below.

Figure 16:
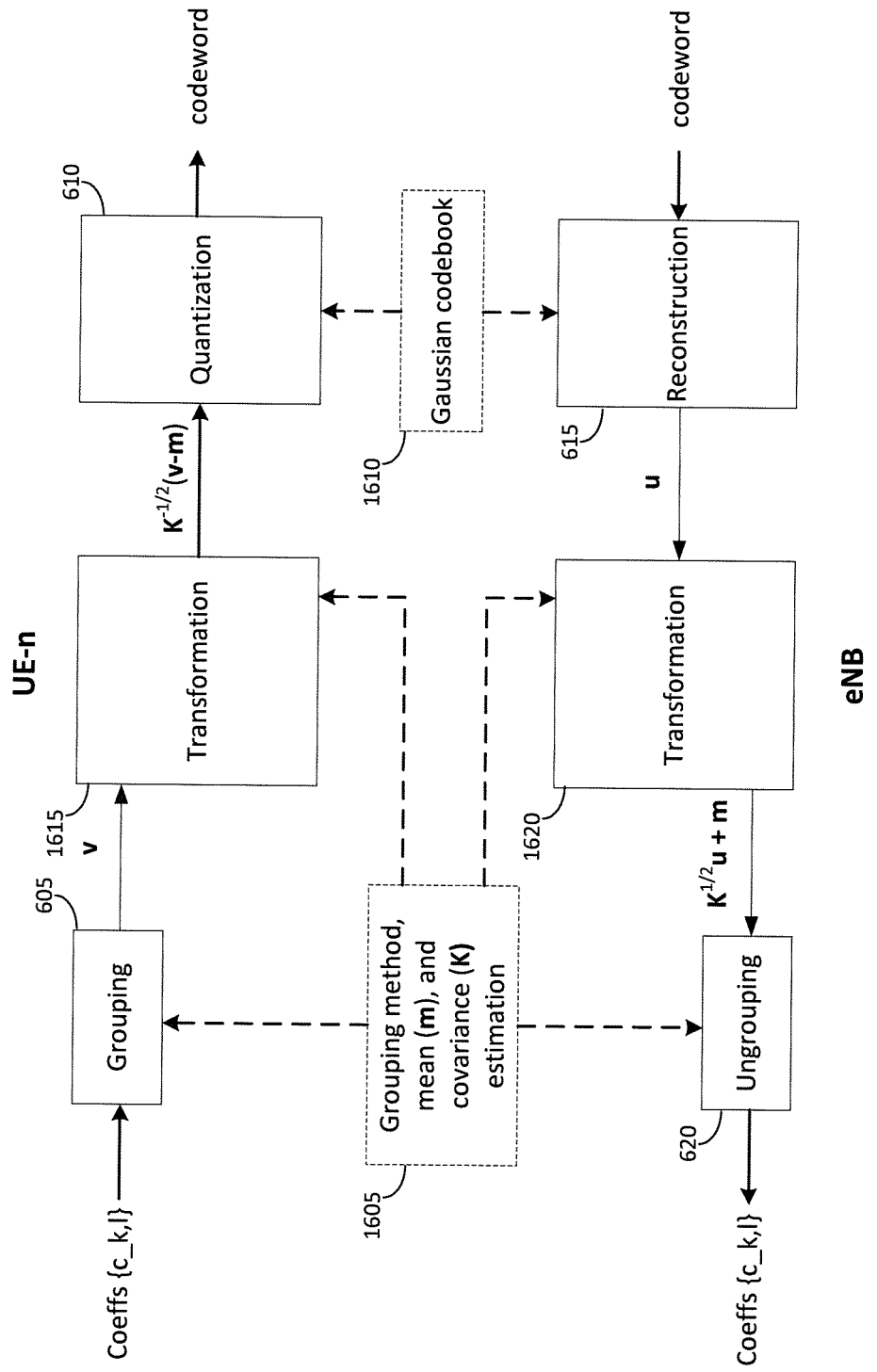
FIG. 16 illustrates an example of high level communication for VQ adaptation based on a Gaussian codebook according to various embodiments of the present disclosure.

FIG. 16 illustrates an example of high level communication for VQ adaptation based on a Gaussian codebook according to various embodiments of the present disclosure. In this illustrative example, FIG. 16 is an example of one implementation of the vector quantization and the reconstruction with vector codebook adaptation illustrated in FIG. 15 using a universal VQ. In various embodiments, the eNB and the UE use a universal VQ (e.g., in this embodiment a Gaussian-based vector quantization codebook), which is parameterized by the mean and covariance parameters. These parameters are estimated either at the eNB or at the UE and are communicated to each other at block 1605. The mean and the covariance of the channel coefficients are denoted by m and K, respectively. For example, the eNB may estimate the channel and signal the mean and covariance of the estimated channel to the UE or vice versa.

The UE transforms grouped channel coefficients at block 1615 by first subtracting the estimated mean from the coefficients and then pre-multiplying the resultant by the inverse square root of the estimated covariance. For example, the transformation at the UE is given by $K^{-1/2}(v-m)$, where v is the vector constructed after channel coefficient grouping. The UE then quantizes the transformed coefficients using a Gaussian VQ at block 1610. The eNB decodes the received codeword after reconstructing the quantized coefficients at block 615. The eNB then applies reverse transformation to obtain the reconstructed channel coefficients vectors $K^{1/2}u+m$ at block 1620.

Figure 17:
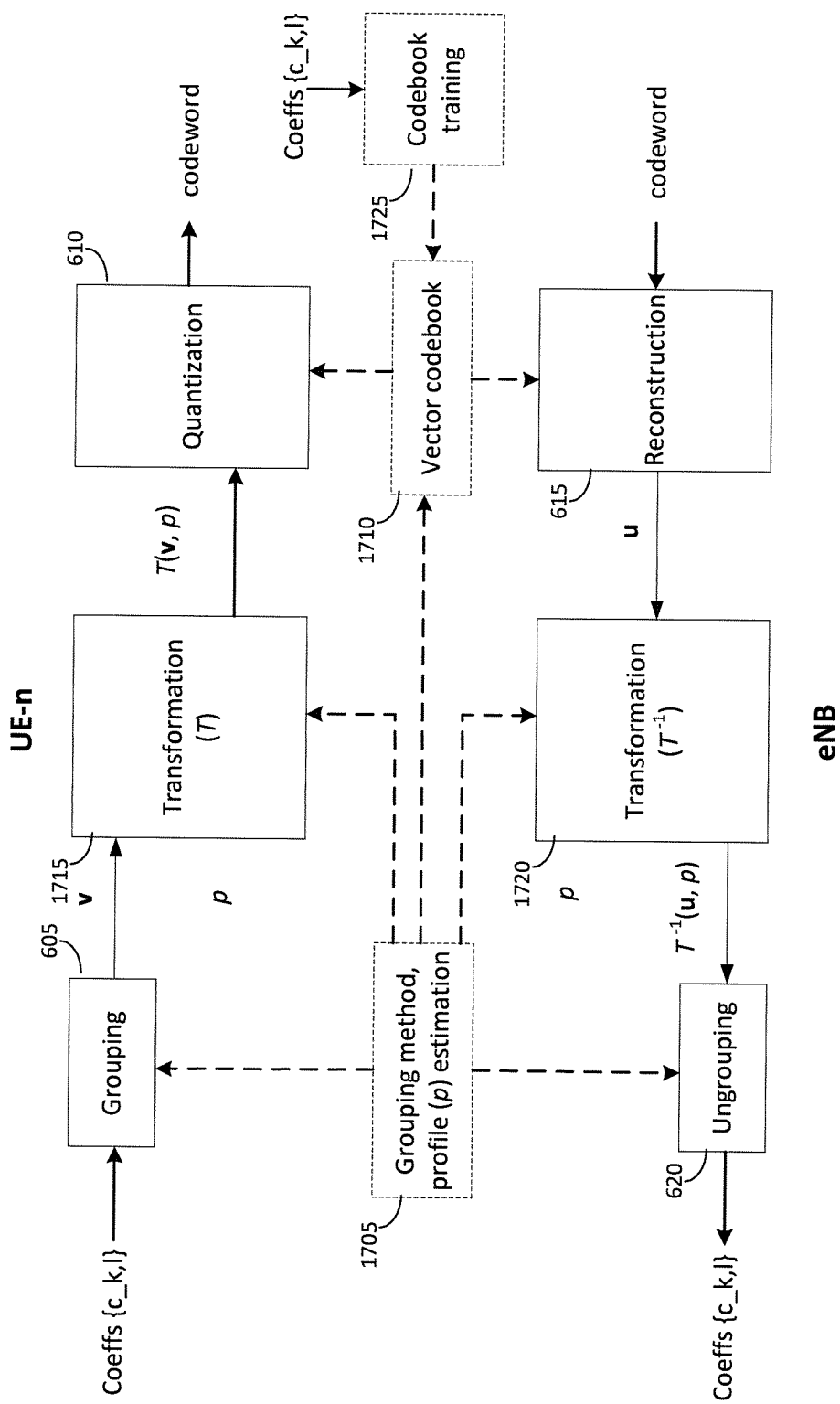
FIG. 17 illustrates an example of high level communication for VQ adaptation based on codebook training according to various embodiments of the present disclosure.

FIG. 17 illustrates an example of high level communication for VQ adaptation based on codebook training according to various embodiments of the present disclosure. In this illustrative example, FIG. 17 is an example of one implementation of the vector quantization and the reconstruction with vector codebook adaptation illustrated in FIG. 15 including codebook training.

In this illustrative embodiment, the vector quantization codebook 1710 is obtained via codebook training performed at block 1725 using actual channel coefficients, for example Lloyd or LBG codebook. For example, periodically or at some point in advance of using the codebook 1710, the UE and the eNB may send and/or train signals to develop the codebook 1710 based on the channel between the UE and the eNB. In this embodiment, the UE may apply a suitable transformation T(v,p) at block 1715 based on the estimated profile p estimated at block 1705 on the grouped channel coefficients v. The eNB applies the corresponding reverse transformation $T^{-1}$ at block 1720.

Figure 18:
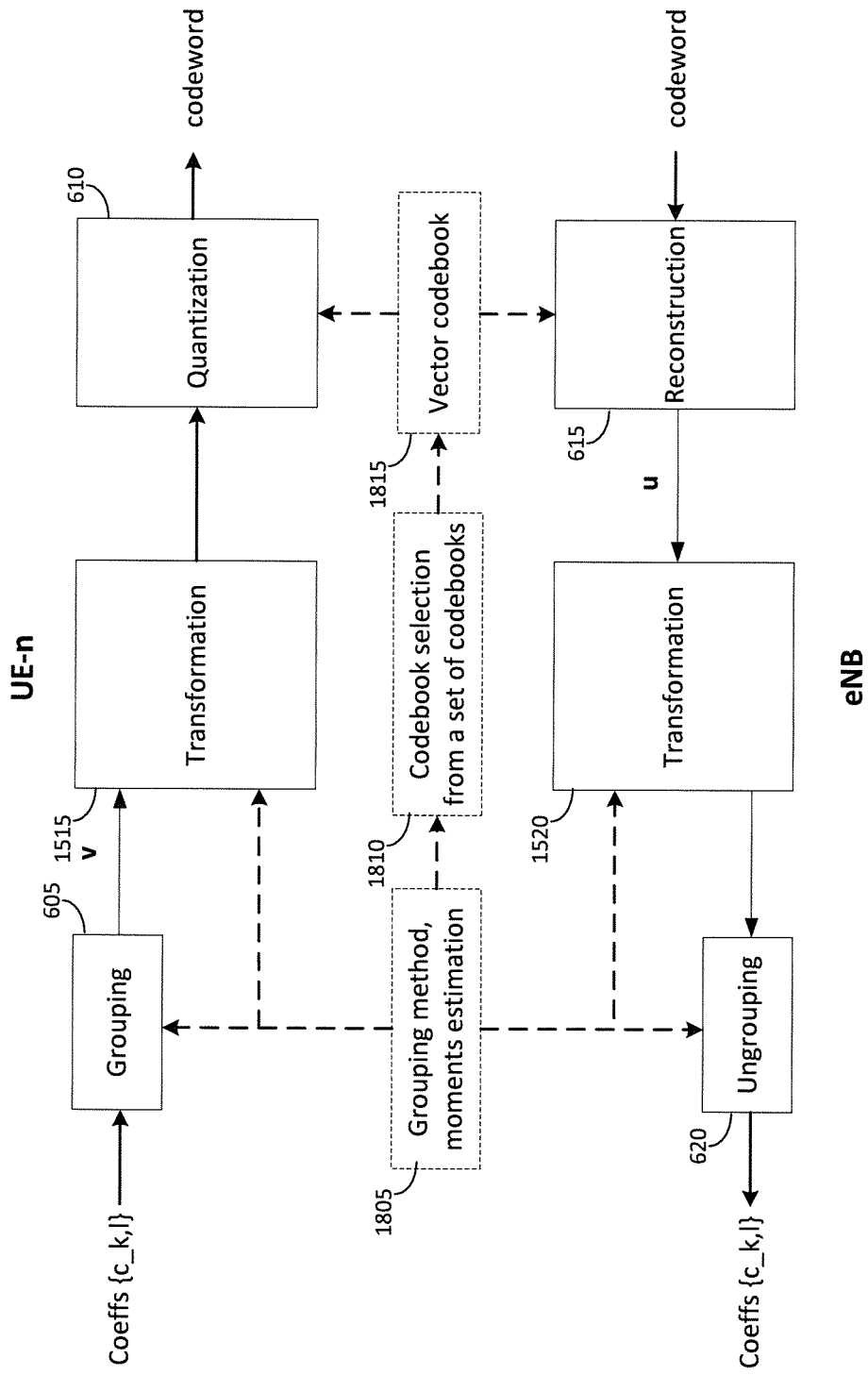
FIG. 18 illustrates an example of high level communication for VQ adaptation using a higher moments based codebook according to various embodiments of the present disclosure.

FIG. 18 illustrates an example of high level communication for VQ adaptation using a higher-moments based codebook according to various embodiments of the present disclosure. In this illustrative example, FIG. 18 is an example of one implementation of the vector quantization and the reconstruction with vector codebook adaptation illustrated in FIG. 15 using a higher-moments based codebook.

In this illustrative embodiment, the UE and the eNB use a set of vector codebooks, and the eNB or the UE selects a vector codebook from this set based on estimated moment(s) of the channel coefficients and signal the selected codebook to the other or the codebook may be preselected based on other criteria. Some examples of moments include: a first order moment corresponding to the mean, a second order moment corresponding to the variance, etc. The UE and the eNB use a set of vector codebooks, which are parameterized by one or more higher moments. The eNB or UE estimates at least one moment at block 1805 and, based on the estimated moment, selects at block 1810 the vector codebook(s) 1815 from the set of vector codebooks for channel coefficient quantization.

Figure 19:
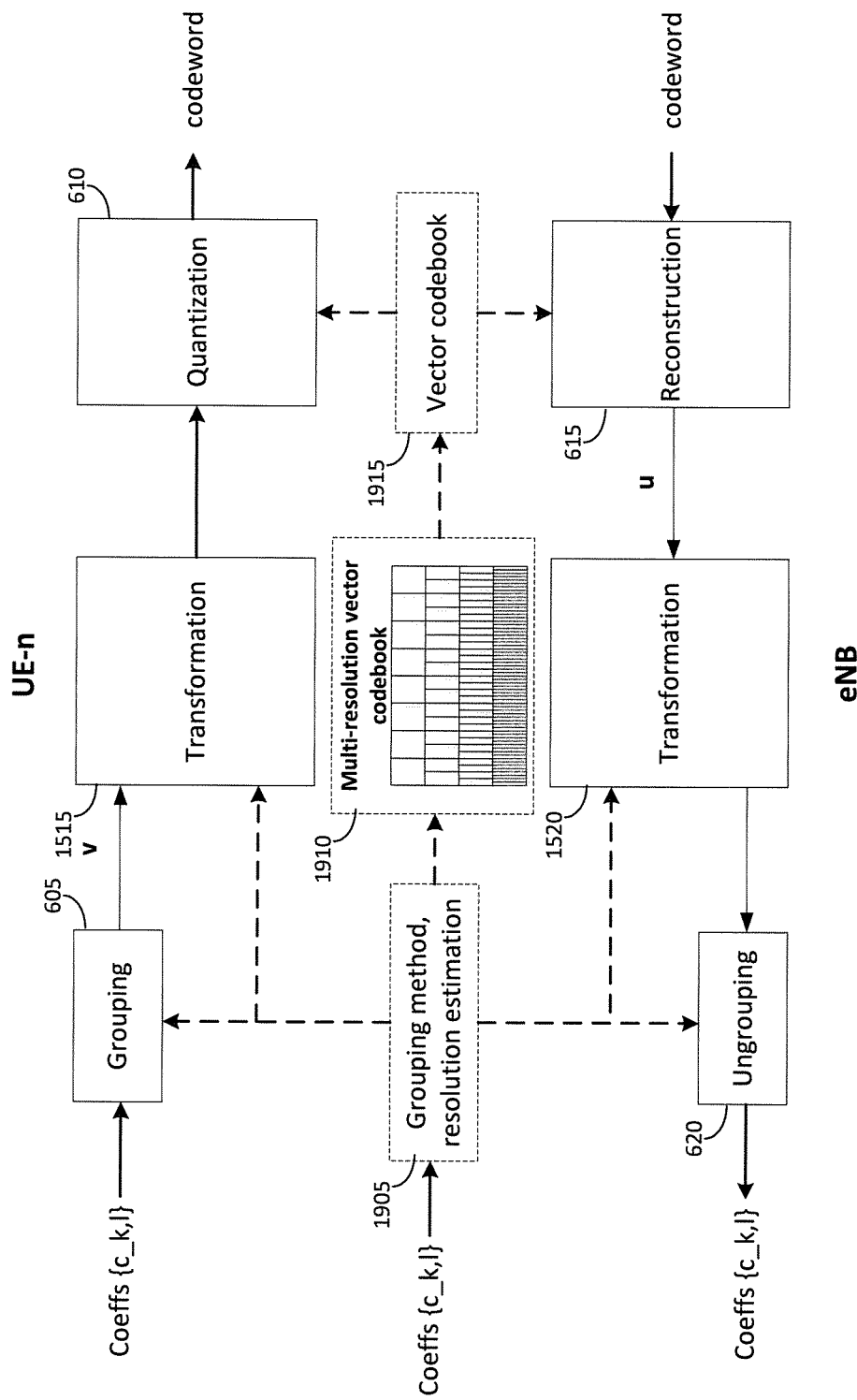
FIG. 19 illustrates an example of high level communication for VQ adaptation based on a multi-resolution vector codebook according to various embodiments of the present disclosure.

FIG. 19 illustrates an example of high level communication for VQ adaptation based on a multi-resolution vector codebook according to various embodiments of the present disclosure. In this illustrative example, FIG. 19 is an example of one implementation of the vector quantization and the reconstruction with vector codebook adaptation illustrated in FIG. 15 using a multi-resolution codebook.

In this illustrative embodiment, the UE and the eNB use a multi-resolution vector codebook, and the UE or the eNB selects a vector codebook from this multi-level codebook based on an estimated desired resolution level. The eNB or the UE may determine a desired resolution for the VQ based on channel conditions at block 1905 and signal the resolution along with other parameters, such as grouping method. For example, in a crowded channel (e.g., multiple UEs with additional signal interference present), additional resolution may be desirable to improve the accuracy of the quantization of the channel coefficients, whereas in a less crowded channel a coarser resolution codebook may provide comparable accuracy while improving signal processing efficiency. The UE and eNB then determine the appropriate vector codebook level(s) from the multi-resolution vector codebook 1910 for use as the vector codebook 1915 in the quantization and reconstruction.

Figure 20:
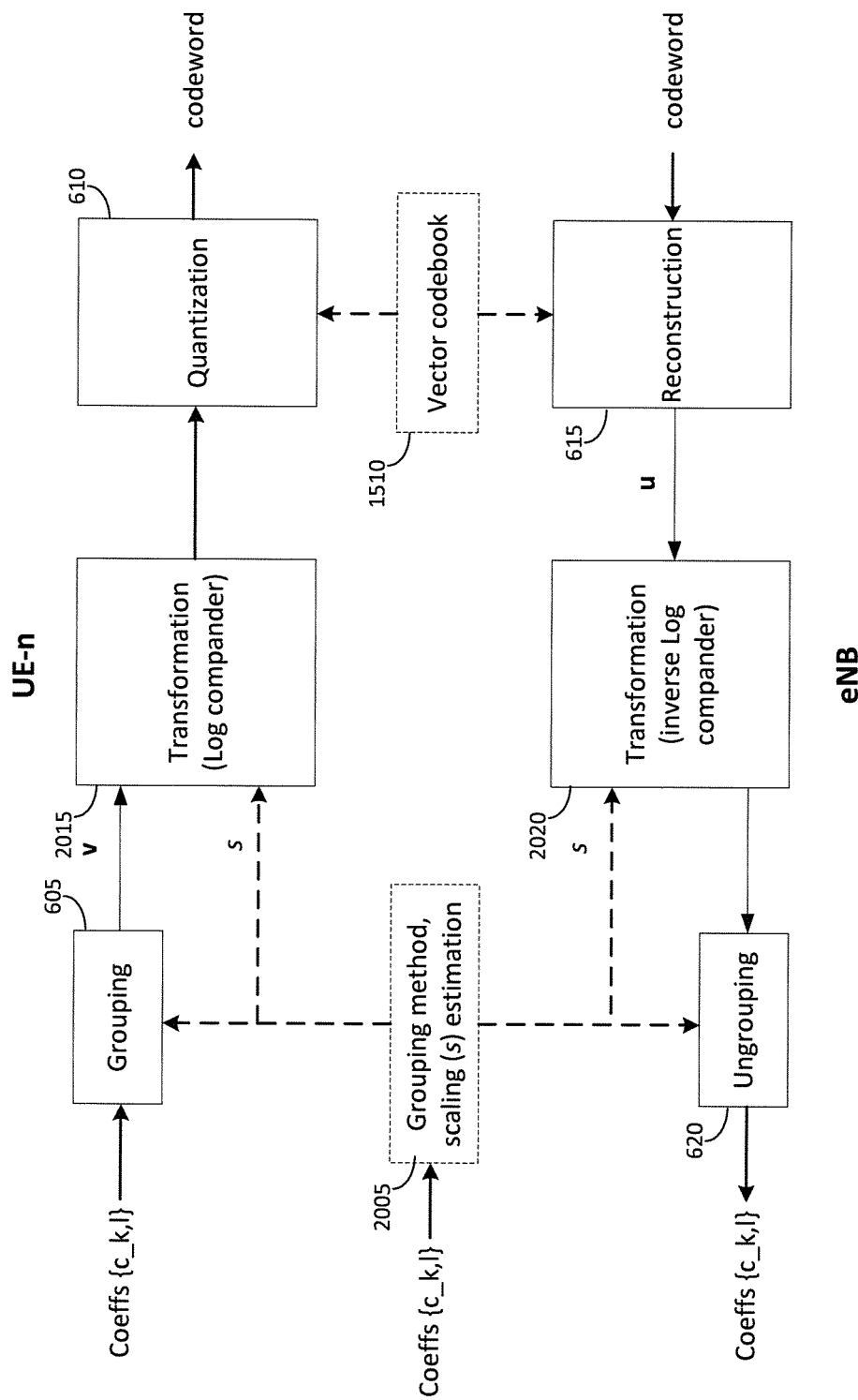
FIG. 20 illustrates an example of high level communication for VQ adaptation based on estimated scaling and a log compander according to various embodiments of the present disclosure.

FIG. 20 illustrates an example of high level communication for VQ adaptation based on estimated scaling and a log compander according to various embodiments of the present disclosure. In this illustrative example, FIG. 20 is an example of one implementation of the vector quantization and the reconstruction with vector codebook adaptation illustrated in FIG. 15 using estimated scaling and a log compander.

In this illustrative embodiment, the eNB and/or the UE perform scaling estimation based on the profile(s) of the channel coefficients at block 2005 and may signal the estimated scaling to the other. The UE applies the estimated scaling after grouping the channel coefficients and then applies a logarithmic compander at block 2015, for example, to ensure that the dynamic range of the coefficients to be quantized is within a desired range. The eNB applies the inverse logarithmic compander and reverse scaling at block 2020 after reconstruction at the eNB. The use of the estimated scaling and a log compander may be advantageous for use with codebooks for a large dynamic range case.

Figure 21:
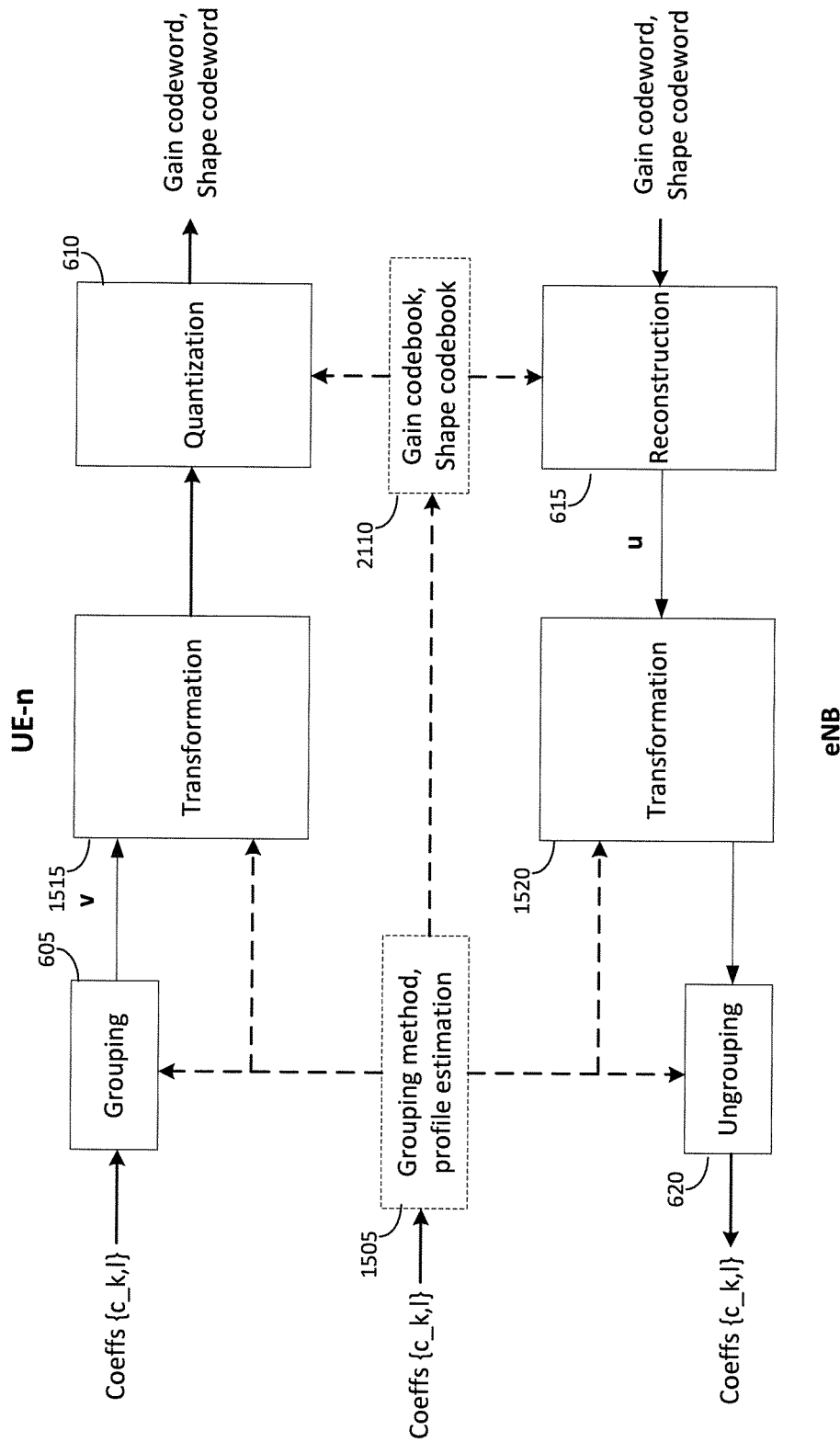
FIG. 21 illustrates an example of high level communication for VQ adaptation based on a shape-gain vector codebook according to various embodiments of the present disclosure.

FIG. 21 illustrates an example of high level communication for VQ adaptation based on a shape-gain vector codebook according to various embodiments of the present disclosure. In this illustrative example, FIG. 21 is an example of one implementation of the vector quantization and the reconstruction with vector codebook adaptation illustrated in FIG. 15 using a shape-gain vector codebook.

In this illustrative embodiment, the vector codebook is a shape-gain vector codebook 2110 in which the magnitude of the grouped channel coefficients is quantized using a (scaler) gain codebook and the corresponding direction (unit vector) is quantized using a (vector) shape codebook. The use of the shape-gain vector codebook 2110 may be particularly advantageous in embodiments where there is a very large dynamic range and a large correlation between grouped coefficients.

Figure 22:
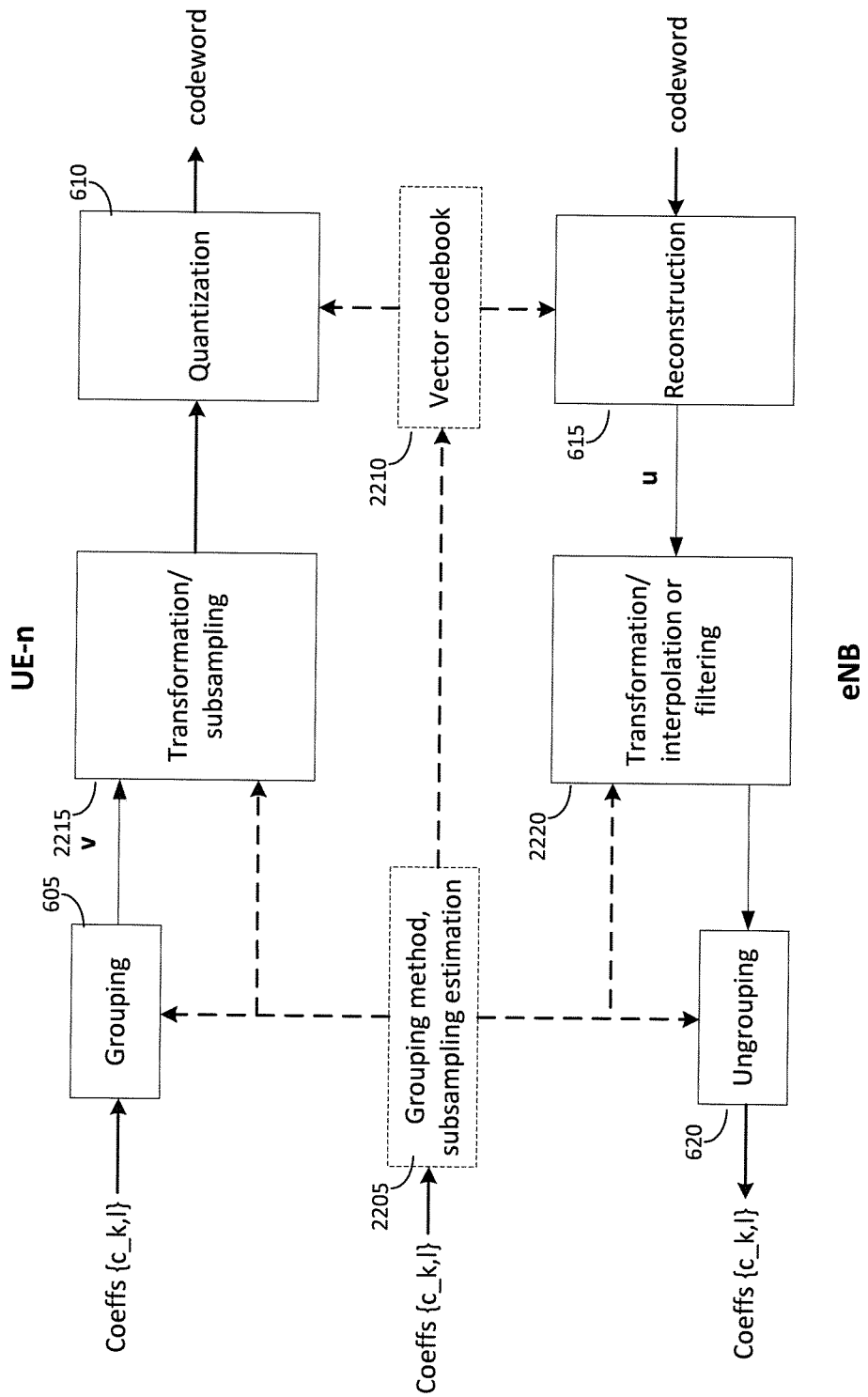
FIG. 22 illustrates an example of high level communication for VQ adaptation using subsampling and interpolation/filtering according to various embodiments of the present disclosure.

FIG. 22 illustrates an example of high level communication for VQ adaptation using subsampling and interpolation/filtering according to various embodiments of the present disclosure. In this illustrative example, FIG. 22 is an example of one implementation of the vector quantization and the reconstruction with vector codebook adaptation illustrated in FIG. 15 using subsampling and interpolation/filtering.

In this illustrative embodiment, the eNB and/or the UE perform subsampling estimation based on the profile(s) of the channel coefficients at block 2205 and may signal the estimated subsampling to the other. Additionally, the transformation blocks 2215 and 2220 at the UE and eNB, respectively, include subsampling and interpolation/filtering of channel coefficients, respectively.

Embodiments of the present disclosure provide an efficient vector quantizer for FD-MIMO systems. Compared to simple or scalar channel quantization and for a given accuracy, embodiments of the present disclosure provide overhead reduction by exploiting the inherent correlations in frequency and/or "coefficient" domain(s).

Although the present disclosure has been described with an example embodiment, various changes and modifications may be suggested to one skilled in the art. It is intended that the present disclosure encompass such changes and modifications as fall within the scope of the appended claims.

None of the description in this application should be read as implying that any particular element, step, or function is an essential element that must be included in the claim scope. The scope of patented subject matter is defined only by the claims. Moreover, none of the claims are intended to invoke 35 U.S.C. § 112(f) unless the exact words "means for" are followed by a participle.

What is claimed is:

1. A method of operating a user equipment (UE) for vector quantization of feedback components, the method comprising:
   identifying a grouping method for grouping channel coefficients for vector quantization and identifying a vector quantization codebook for vector quantization of grouped vectors based on one or more control signals received from an eNode B (eNB);
   computing channel coefficients based on at least one channel measurement;
   grouping the computed channel coefficients according to the identified grouping method to form a set of vectors;
   performing vector quantization of the vectors using the identified vector quantization codebook;
   processing the quantized vectors into one or more feedback signals; and
   transmitting the one or more feedback signals to the eNB.

2. The method of claim 1, wherein identifying the grouping method and the vector quantization codebook for grouping channel coefficients into vectors and for vector quantization of grouped vectors, respectively, comprise identifying, from the one or more control signals, an indication of a selected grouping method from a predetermined set of grouping methods and a selected vector quantization codebook from a predetermined set of vector quantization codebooks.

3. The method of claim 1, further comprising:
   estimating at least one profile of the channel coefficients based on the at least one channel measurement,
   wherein transmitting the one or more feedback signals to the eNB comprises transmitting feedback associated with the at least one estimated profile for the eNB to determine quantization parameters for vector quantization of channel coefficients by the UE.

4. The method of claim 3, wherein the quantization parameters include a selection of at least one grouping method from a set of grouping methods and at least one vector quantization codebook from a set of vector quantization codebooks.

5. The method of claim 1, wherein performing the vector quantization of the vectors using the vector quantization codebook comprises using at least two different types of vector quantization for quantization of the channel coefficients based on different levels of correlations within a channel.

6. A method of operating an eNode B (eNB) for processing of vector quantized feedback, the method comprising:
   transmitting, to a user equipment (UE), one or more control signals indicating a grouping method for grouping channel coefficients for vector quantization and a vector quantization codebook for vector quantization of grouped vectors;
   receiving one or more feedback signals from the UE;
   performing reconstruction of quantized channel coefficients identified from the one or more feedback signals using the indicated vector quantization codebook, wherein the channel coefficients based on at least one channel measurement; and
   ungrouping the reconstructed channel coefficients based on the indicated grouping method.

7. The method of claim 6, further comprising:
   estimating at least one profile of the quantized channel coefficients identified from the one or more feedback signals;
   selecting the grouping method for grouping of channel coefficients for vector quantization of feedback by the UE from a predetermined set of grouping methods based on the at least one estimated profile; and
   selecting the vector quantization codebook for vector quantization of grouped vectors by the UE from a predetermined set of vector quantization codebooks based on the at least one estimated profile.

8. The method of claim 6, further comprising:
   measuring a distribution of the quantized channel coefficients;
   determining quantization parameters for vector quantization of grouped channel coefficients feedback by the UE; and
   sending, to the UE, at least one control signal indicating the quantization parameters for vector quantization of grouped channel coefficients for the UE feedback.

9. The method of claim 8, wherein the quantization parameters include a selection of at least one grouping method from a set of grouping methods and at least one vector quantization codebook from a set of vector quantization codebooks.

10. An apparatus of a user equipment (UE) for vector quantization of feedback components, the apparatus comprising:
    at least one processor configured to:
       identify a grouping method for grouping channel coefficients for vector quantization and identify a vector quantization codebook for vector quantization of grouped vectors based on one or more control signals received from an eNode B (eNB),
       compute channel coefficients based on at least one channel measurement,
       group the computed channel coefficients according to the identified grouping method to form a set of vectors,
       perform vector quantization of the vectors using the identified vector quantization codebook, and
       process the quantized vectors into one or more feedback signals; and
    a transceiver configured to transmit the one or more feedback signals to the eNB.

11. The apparatus of claim 10, wherein the at least one processor is configured to identify, from the one or more control signals, an indication of a selected grouping method from a predetermined set of grouping methods and a selected vector quantization codebook from a predetermined set of vector quantization codebooks.

12. The apparatus of claim 10, wherein:
    the at least one processor is further configured estimate at least one profile of the channel coefficients based on the at least one channel measurement, and
    the transceiver is configured to transmit feedback associated with the at least one estimated profile for the eNB to determine quantization parameters for vector quantization of channel coefficients by the UE.

13. The apparatus of claim 12, wherein the quantization parameters include a selection of at least one grouping method from a set of grouping methods and at least one vector quantization codebook from a set of vector quantization codebooks.

14. The apparatus of claim 10, wherein the at least one processor is configured to perform the vector quantization of the vectors using at least two different types of vector quantization for quantization of the channel coefficients based on different levels of correlations within a channel.

15. An apparatus of an eNode B (eNB) for processing of vector quantized feedback, the apparatus comprising:
a transceiver configured to:
transmit, to a user equipment (UE), one or more control signals indicating a grouping method for grouping channel coefficients for vector quantization and a vector quantization codebook for vector quantization of grouped vectors;
receive one or more feedback signals from the UE; and
at least one processor configured to:
perform reconstruction of quantized channel coefficients identified from the one or more feedback signals using the indicated vector quantization codebook, wherein the channel coefficients based on at least one channel measurement, and
ungroup the reconstructed channel coefficients based on the indicated grouping method.

16. The apparatus of claim 15, wherein:
the at least one processor is further configured to:
estimate at least one profile of the quantized channel coefficients identified from the one or more feedback signals;
select the vector quantization codebook for vector quantization of grouped vectors by the UE from a predetermined set of vector quantization codebooks based on the at least one estimated profile; and
select the grouping method for grouping of channel coefficients for vector quantization of feedback by the UE from a predetermined set of grouping methods based on the at least one estimated profile.

17. The apparatus of claim 15, wherein:
the at least one processor is further configured to measure a distribution of the quantized channel coefficients and determine quantization parameters for vector quantization of grouped channel coefficients feedback by the UE, and
the transceiver is further configured to send, to the UE, at least one control signal indicating the quantization parameters for vector quantization of grouped channel coefficients for the UE feedback.

18. The apparatus of claim 17, wherein the quantization parameters include a selection of at least one grouping method from a set of grouping methods and at least one vector quantization codebook from a set of vector quantization codebooks.

19. The apparatus of claim 15, wherein the transceiver is further configured to signal, to the UE, information indicating for the UE to use at least two different types of vector quantization for quantization of the channel coefficients fed back by the UE based on different levels of correlations within a channel.

20. The method of claim 1, wherein the channel coefficients indicate measurements of a channel between the eNB and the UE.

* * * * *